US011550196B2

(12) United States Patent
Okada et al.

(10) Patent No.: US 11,550,196 B2
(45) Date of Patent: Jan. 10, 2023

(54) SEMICONDUCTOR DEVICE AND DISPLAY DEVICE

(71) Applicant: SHARP KABUSHIKI KAISHA, Sakai (JP)

(72) Inventors: Kuniaki Okada, Sakai (JP); Atsushi Hachiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/671,901

(22) Filed: Feb. 15, 2022

(65) Prior Publication Data

US 2022/0291559 A1    Sep. 15, 2022

Related U.S. Application Data

(60) Provisional application No. 63/158,854, filed on Mar. 9, 2021.

(51) Int. Cl.
*G02F 1/1368* (2006.01)
*G02F 1/1362* (2006.01)
*H01L 27/12* (2006.01)

(52) U.S. Cl.
CPC ...... *G02F 1/136286* (2013.01); *G02F 1/1368* (2013.01); *G02F 1/136209* (2013.01); *H01L 27/124* (2013.01)

(58) Field of Classification Search
CPC ........................... G02F 1/13685; G02F 1/1368
See application file for complete search history.

(56) References Cited

U.S. PATENT DOCUMENTS

2017/0090229 A1* 3/2017 Imai .................. H01L 29/78633
2017/0117302 A1* 4/2017 Zhang ............... H01L 29/41733

FOREIGN PATENT DOCUMENTS

WO        2015/186619 A1    12/2015

* cited by examiner

*Primary Examiner* — James A Dudek
(74) *Attorney, Agent, or Firm* — ScienBiziP, P.C.

(57) ABSTRACT

A display device in the present disclosure includes the following: a substrate; a plurality of source bus lines extending in a first direction above the substrate; a plurality of semiconductor layers extending in the first direction above the plurality of source bus lines; and a first groove-shaped recess extending in a second direction crossing the first direction, the first groove-shaped recess constituting a first contact hole extending from above the plurality of source bus lines to the plurality of source bus lines. Each of the plurality of semiconductor layers is disposed along a surface of the first groove-shaped recess so as to cross the first groove-shaped recess, and each of the plurality of semiconductor layers is electrically connected to each of the plurality of source bus lines on the bottom surface of the first groove-shaped recess.

6 Claims, 19 Drawing Sheets

SEMICONDUCTOR DEVICE AND DISPLAY DEVICE

CROSS-REFERENCE TO RELATED APPLICATION

The present application claims priority from Provisional Application No. 63/158,854, the content to which is hereby incorporated by reference into this application.

BACKGROUND

1. Field

The present disclosure relates to a semiconductor device and a display device.

2. Description of the Related Art

An active-matrix substrate used in display devices, such as liquid crystal displays, includes a thin-film transistor (hereinafter referred to as a TFT), which is a switching element, provided for each pixel. Although amorphous silicon, polycrystalline silicon, or other materials are conventionally used as the material of an active layer of a TFT, an oxide semiconductor, such as zinc oxide, has been recently used for reasons, including that such an oxide semiconductor has large electron mobility and is relatively easy to process into a film. A display device is controlled by many TFTs arranged in matrix. PCT International Publication No. WO2015/186619 discloses an active-matrix substrate with many source bus lines and many gate bus lines arranged in the form of a lattice in a plan view. In addition, a single TFT and a single pixel electrode are disposed in a single rectangular pixel region defined by two source bus lines and two gate bus lines.

SUMMARY

Progress toward a high-definition display device offers pixel regions each having a very small size in a plan view, in a semiconductor device for controlling a display device. The semiconductor device thus has a pixel electrode layer that is small in area in a plan view. However, it is difficult to reduce the area of occupation of the TFTs to a certain degree or less, in order to maintain the performance of the TFTs. The ratio of the TFT occupation area hence increases within the pixel region. As a result, a high-definition display device involves a small distance between its TFTs within pixel regions adjacent to each other. The adjacent TFTs affect each other adversely, thereby possibly degrading the display quality of the display device. It is hence difficult to produce a high-definition display device.

To solve this problem, it is an object of the present disclosure to provide a semiconductor device that achieves a high-definition display device. PCT International Publication No. WO2015/186619 discloses a light-emitting-diode light source, which unfortunately causes brightness unevenness in its light emission surface. The present disclosure has been made to solve this problem. It is an object of the present disclosure to provide a light-emitter-mounted substrate and a backlight both of which can prevent brightness unevenness in a light emission surface.

A display device in the present disclosure includes the following: a substrate; a plurality of source bus lines extending in a first direction above the substrate; a plurality of semiconductor layers extending in the first direction above the plurality of source bus lines; and a first groove-shaped recess extending in a second direction crossing the first direction, the first groove-shaped recess constituting a first contact hole extending from above the plurality of source bus lines to the plurality of source bus lines. Each of the plurality of semiconductor layers is disposed along a surface of the first groove-shaped recess so as to cross the first groove-shaped recess, and each of the plurality of semiconductor layers is electrically connected to each of the plurality of source bus lines on the bottom surface of the first groove-shaped recess.

DESCRIPTION OF PREFERRED EMBODIMENTS

Figure 1:
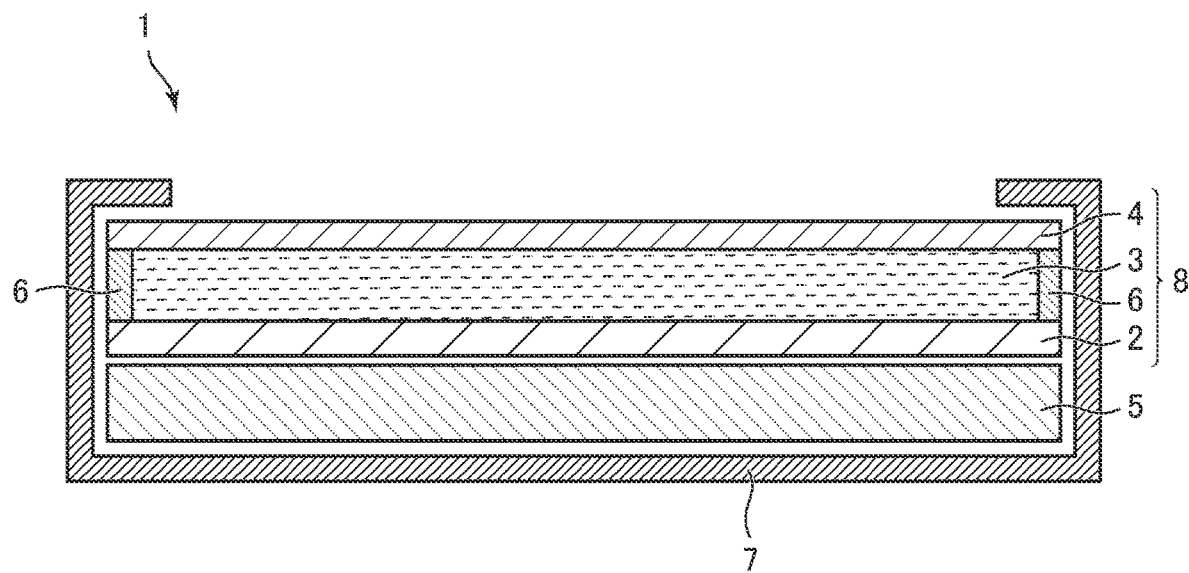
FIG. 1 is a sectional view of a display device in the present disclosure.

The preferred embodiments of the present disclosure will be described with reference to the drawings. In the drawings, identical or equivalent components will be denoted by the same signs. Identical or equivalent configurations will not be described repeatedly in each preferred embodiment. In the following description, the wording "above" and the wording "under" indicate a relative positional relationship between the components and are thus not limited to an absolute positional relationship therebetween.

First Preferred Embodiment

A first preferred embodiment of the present disclosure will be described with reference to FIGS. 1 to 9. FIG. 1 is a schematic sectional view of a display device 1 in the present disclosure. The display device 1 has the following: a display panel 8 including a semiconductor device 2, a liquid crystal layer 3, a counter substrate 4, and a sealant 6; a light source 5; and a casing 7. In the display panel 8, the sealant 6 is disposed on the side surface of the liquid crystal layer 3, and the liquid crystal layer 3 is sealed in a space sandwiched between the semiconductor device 2 and counter substrate 4. FIG. 1 illustrates the semiconductor device 2, which is herein an active-matrix substrate 2 including a plurality of thin-film transistors (hereinafter referred to as TFTs) not shown. In the following description, the semiconductor device 2 is also referred to as the active-matrix substrate 2.

The display panel 8 in FIG. 1 includes the active-matrix substrate 2, the liquid crystal layer 3, the counter substrate 4, and the sealant 6. The active-matrix substrate 2 and the counter substrate 4 are joined together by the sealant 6 with predetermined spacing interposed therebetween. The liquid crystal layer 3 is sealed between the active-matrix substrate 2 and counter electrode 4. Although not shown, the display panel 8 has a flat-plate shape in a plan view, and the sealant 6 has a frame shape surrounding the perimeter of the display panel 8.

The active-matrix substrate 2 has a transparent substrate of glass or other materials, on which a plurality of TFTs (i.e., switching elements), a plurality of pixel electrodes electrically connected to the TFTs, and other components are arranged in matrix in a plan view.

The counter substrate 4 faces the active-matrix substrate 2 and transmits light. The counter substrate 4 has an upper surface on which, although not shown, components, including a color filter with colored portions of red, green, blue and other colors arranged, and an alignment film that controls the alignment of the liquid crystals within the liquid crystal layer 3, are disposed. Although not shown in FIG. 1, a polarizer plate is disposed on each of the lower surface of the active-matrix substrate 2 and the upper surface of the counter substrate 4.

The light source 5 emits light toward the display panel 8 by the use of light emitters, such as light-emitting diodes. As illustrated in FIG. 1, the light source 5 is disposed close to the active-matrix substrate 2 of the display panel 8 and emits light toward the active-matrix substrate 2. The display device 1 displays an image on its display surface by the use of light supplied from the light source 5.

The light source 5 of the display device 1 in the present disclosure overlaps the liquid crystal layer 3. As seen from FIG. 1, the light source 5 in the present disclosure is disposed close to the lower surface of the active-matrix substrate 2. The light source 5 in FIG. 1 emits light toward the liquid crystal layer 3. That is, FIG. 1 shows the light source 5 that emits light upward, and the counter substrate 4 having an upper surface serving as the display screen of the display device 1.

Figure 2:
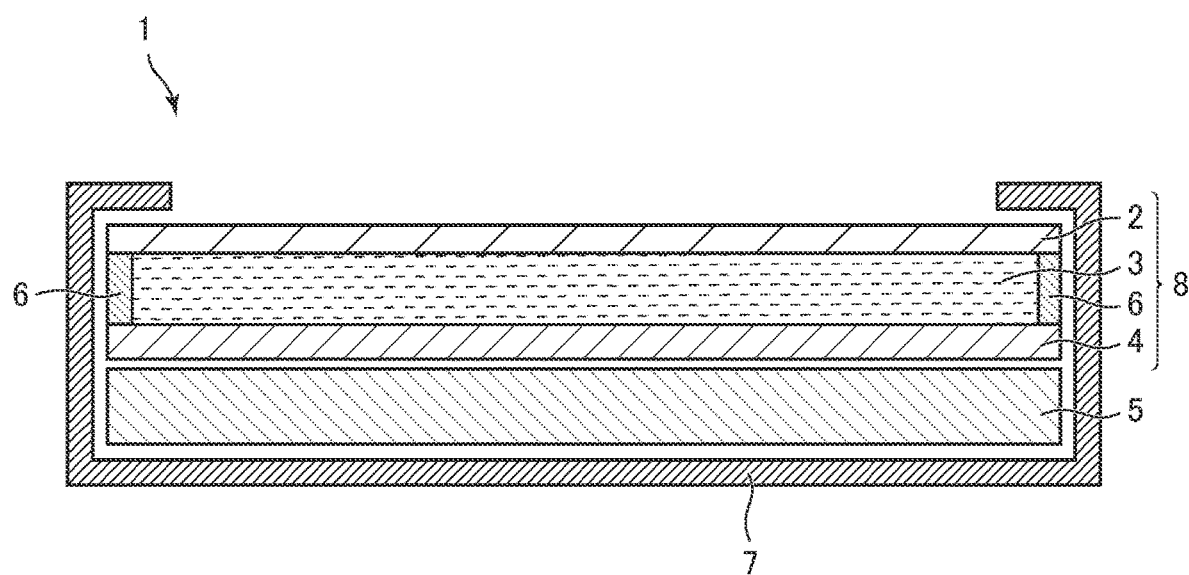
FIG. 2 is a sectional view of a modification of the display device in the present disclosure.

FIG. 2 is a sectional view of a modification of the display device 1 in the present disclosure. The display device 1 in FIG. 2 is different from the display device 1 in FIG. 1 in that the display panel 8 is disposed upside down on the upper surface of the light source 5. The light source 5 in FIG. 2 emits light toward the liquid crystal layer 3. That is, the light source 5 emits light upward, and the upper surface of the active-matrix substrate 2 serves as the display screen of the display device 1.

Figure 3:
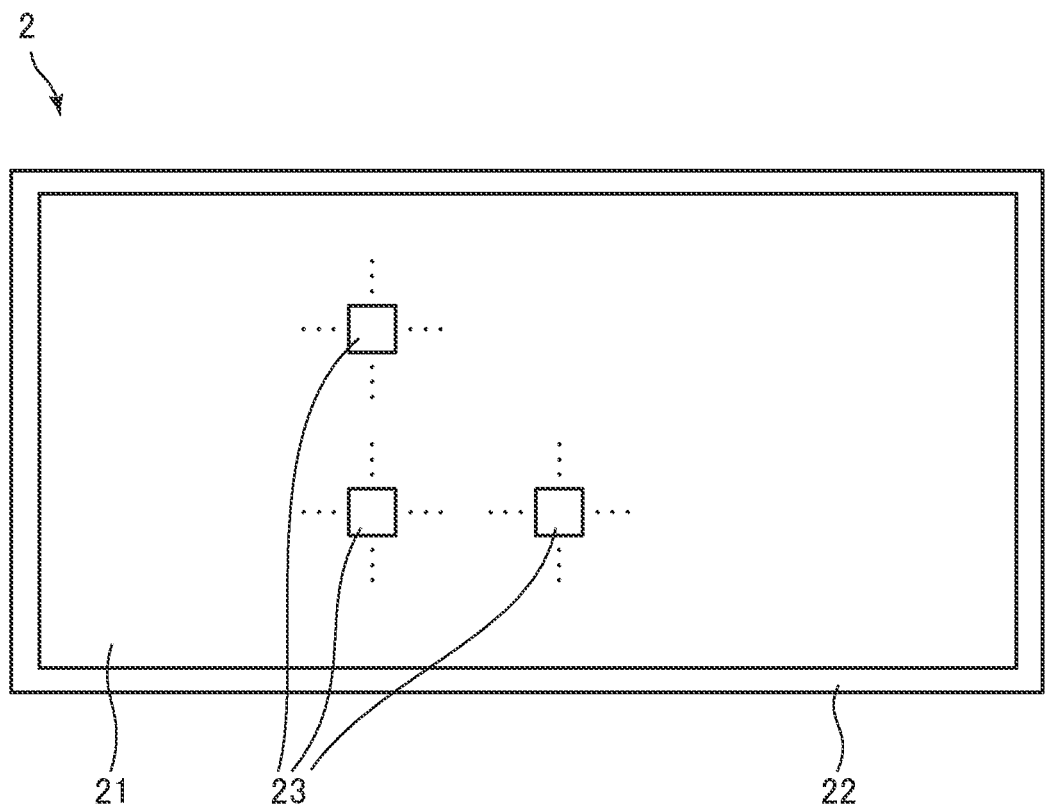
FIG. 3 is a plan view of a semiconductor device in the present disclosure.

FIG. 3 is a plan view of the active-matrix substrate 2 in the present disclosure. The active-matrix substrate 2 has a display region 21 and a frame region 22.

The display region 21 includes a plurality of pixels 23 arranged in matrix. Although not shown, the display region 21 includes components, such as an active-matrix circuit including the TFTs, and the frame region 22 includes a peripheral circuit for controlling the components disposed in the display region 21. Further although not shown, the display region 21 of the active-matrix substrate 2 includes source bus lines and gate bus lines arranged so as to section the TFTs and other components. Furthermore, although not shown, the active-matrix substrate 2 includes a common electrode facing the pixel electrodes, and the alignment film that controls the alignment of the liquid crystals contained in the liquid crystal layer 3. The alignment film covers the pixel electrodes and other components.

The plurality of pixels 23 are arranged in matrix in the display region 21. The alignment of the liquid crystal molecules within the liquid crystal layer 3 shown in FIG. 1 is each individually controlled in a plurality of regions facing each of the plurality of pixels, thus displaying a desired image in the display region 21.

First Preferred Embodiment

Figure 4:
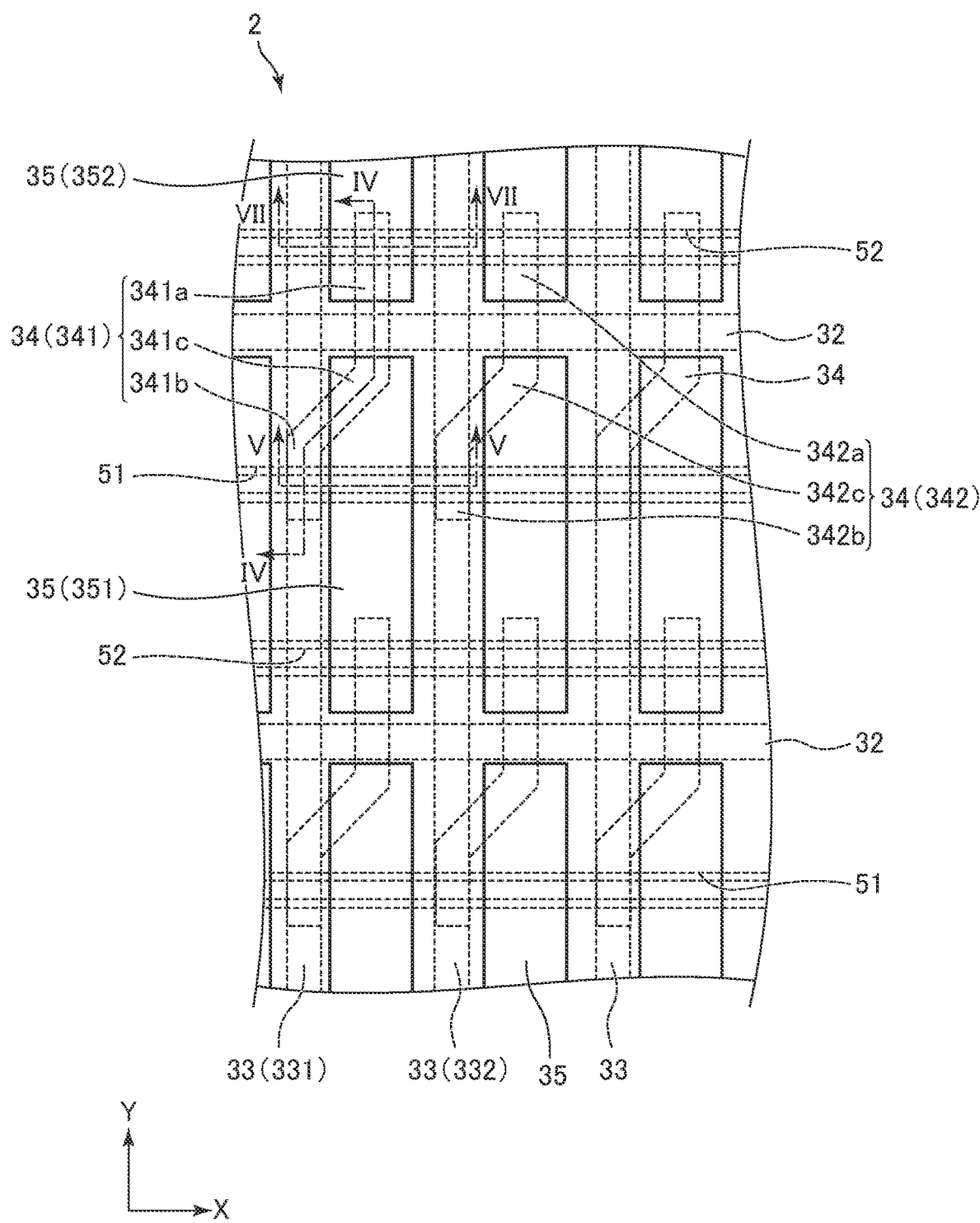
FIG. 4 is a plan view of part of an active-matrix substrate in a first preferred embodiment.
Figure 5:
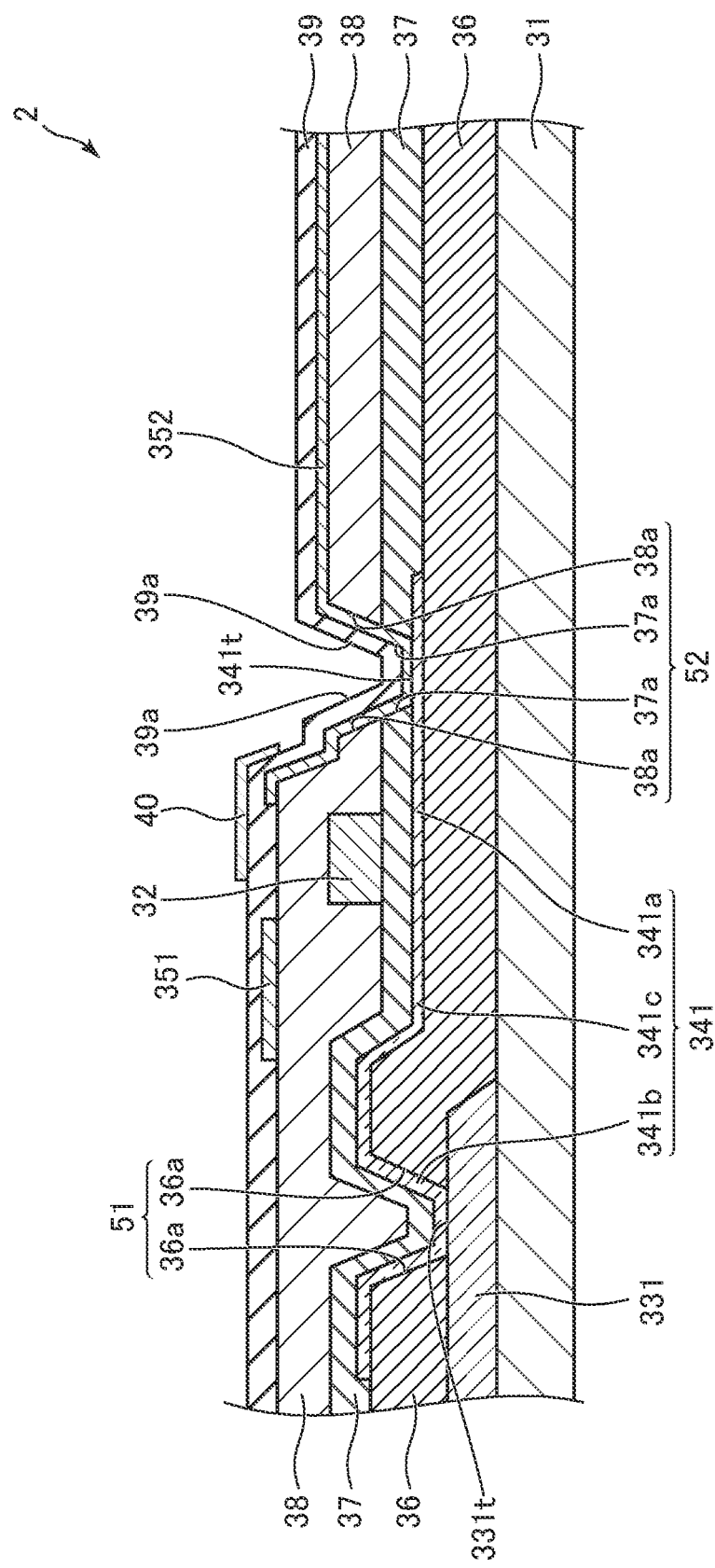
FIG. 5 is a sectional view taken along line IV-IV in FIG. 4.

FIG. 4 is a plan view of part of the active-matrix substrate 2 in the first preferred embodiment of the present disclosure. FIG. 5 is a sectional view taken along line IV-IV in FIG. 4. FIG. 4 shows a Y-direction that is a first direction, and an X-direction that is a second direction crossing the first direction. The Y-direction and the X-direction are orthogonal to each other in a plane. In any of the drawings described below, the first direction is the Y-direction, and the second direction is the X-direction.

FIG. 4 shows a preferred configuration, where each of a plurality of semiconductor layers 34 that partly overlap each of a plurality of pixel electrode layers 35 is made of a material having light transparency. Such a light-transparency material allows light emitted from the light source 5 (cf., FIG. 1) and reached the active-matrix substrate 2 to transmit through the semiconductor layers 34 and then to pass through the liquid crystal layer 3 and counter electrode 4. Thus, even reducing pixel size to achieve the display device 1 of high definition enables each of the plurality of pixel electrode layers 35 and each of the plurality of semiconductor layers 34 to overlap each other, thus preventing reduction in the aperture ratio of the display device 1.

As illustrated in FIG. 4, located between a first semiconductor layer 341 and a second semiconductor layer 342 adjacent to each other in the X-direction is a space allocated for a second source bus line 332 or a first pixel electrode layer 351. This can increase the distance between the plurality of semiconductor layers 34 adjacent to each other even when the display device 1 is improved to have high definition to thus reduce pixel size. The performance of the display device 1 can be consequently less degraded by the plurality of adjacent semiconductor layers 34 that affect each other when the TFT operates.

As illustrated in FIGS. 4 and 5, the active-matrix substrate 2 in the first preferred embodiment has a substrate 31, a plurality of gate bus lines 32, a plurality of source bus lines 33, the plurality of semiconductor layers 34, and the plurality of pixel electrode layers 35. FIG. 4 is a plan view of a configuration where the pixel electrode layers 35 are positioned on the top with a third insulating layer 39 and a common-electrode layer 40, both shown in FIG. 5, being omitted. In FIG. 4, the pixel electrode layers 35 are indicated by solid-line outlines, and components closer to the active-matrix substrate 2 than the pixel electrode layers 35 are indicated by dotted-line outlines. The source bus lines 33 and gate bus lines 32 are made of metal.

The substrate 31 is made of a light-transparency material, such as glass or transparent resin. As illustrated in FIGS. 4 and 5, the source bus lines 33 are disposed on the upper surface of the substrate 31. The plurality of source bus lines 33 extend in a straight line in the Y-direction. The plurality of source bus lines 33 are arranged in parallel in the X-direction at spacing. Hereinafter, two of the plurality of source bus lines 33 adjacent to each other in the X-direction will be also referred to as a first source bus line 331 and a second source bus line 332, as necessary.

FIG. 5 shows a first insulating layer 36, which is disposed on the upper surfaces of the substrate 31 and first source bus line 331. The first insulating layer 36 is provided for insulating each source bus line 33 from other conductive layers stacked above the source bus line 33, except for part of the semiconductor layer 34 electrically connected to the source bus line 33.

As illustrated in FIG. 4, the active-matrix substrate 2 includes the plurality of semiconductor layers 34. The plurality of semiconductor layers 34 are composed of, for instance, an In—Ga—Zn—O oxide semiconductor. The semiconductor layers 34 can be alternatively composed of a light-transparency semiconductor material. Hereinafter, two of the plurality of semiconductor layers 34 adjacent to each other in the X-direction will be also referred to as a first semiconductor layer 341 and a second semiconductor layer 342, as necessary. As illustrated in FIG. 5, the first semiconductor layer 341 is disposed on the upper surface of the first insulating layer 36.

As illustrated in FIG. 5, bored in the first insulating layer 36 is a first groove-shaped recess 51, which constitutes a first contact hole extending from above to the first source bus line 331. To be specific, the first insulating layer 36 undergoes partial removal, thus forming two walls 36a extending in parallel in the X-direction shown in FIG. 4. In other words, the two walls 36a face each other in the Y-direction shown in FIG. 4. As illustrated in FIG. 4, the first groove-shaped recess 51 extends in the X-direction in a straight line and cross the plurality of source bus lines 33 as well as the plurality of semiconductor layers 34 in a plan view.

As seen from FIGS. 4 and 5, the first semiconductor layer 341 has a first portion 341a, a second portion 341b, and a third portion 341c. The first portion 341a extends in the Y-direction from under the corresponding pixel electrode layer 35 in a plan view. The first portion 341a crosses the corresponding gate bus line 32 under the gate bus line 32. The second portion 341b extends in the Y-direction above the first source bus line 331. The second portion 341b crosses the first groove-shaped recess 51. The first portion 341a and the second portion 341b are arranged in the X-direction and the Y-direction at spacing. The third portion 341c extends in a direction oblique to the direction where the first portion 341a and second portion 341b extend, so as to connect the first portion 341a and second portion 341b together. Likewise, the second semiconductor layer 342 has a first portion 342a, a second portion 342b, and a third portion 342c. The shape and size of each of the first portion 342a, second portion 342b and third portion 342c and their positional relationship are similar to the foregoing shape and size of each of the first portion 341a, second portion 341b and third portion 341c and their positional relationship.

As illustrated in FIG. 5, the gate insulating film 37 is disposed on the upper surface of the first semiconductor layer 341, and the gate bus lines 32 are disposed on the upper surface of the gate insulating film 37. That is, the gate insulating film 37 is provided for insulating the first semiconductor layer 341 from the gate bus line 32.

As illustrated in FIG. 4, the plurality of gate bus lines 32 extend in the X-direction in a plan view. The plurality of gate bus lines 32 are arranged in parallel in the Y-direction at spacing. As illustrated in FIGS. 4 and 5, the plurality of gate bus lines 32 each cross the plurality of source bus lines 33 and the plurality of semiconductor layers 34.

FIG. 5 shows a second insulating layer 38, which is disposed on the upper surfaces of the gate bus lines 32 and gate insulating film 37. The second insulating layer 38 is provided for insulating the gate bus lines 32 from other conductive layers stacked above the gate bus lines 32.

As illustrated in FIG. 5, bored in the gate insulating film 37 and second insulating layer 38 is a second groove-shaped recess 52, which constitutes a second contact hole extending from above to the first portion 341a of the first semiconductor layer 341. To be specific, the second insulating layer 38 undergoes partial removal, thus forming two walls 38a extending in parallel in the X-direction. In addition, the gate insulating film 37 is partly removed continuously under the two walls 38a. This forms two walls 37a extending in the X-direction under the two walls 38a. As seen from FIG. 5, each of the two walls 38a is continuous with each of the two walls 37a in their up-and-down direction. The two walls 38a face each other in the Y-direction, and the two walls 37a face each other in the Y-direction. As illustrated in FIG. 4, the second groove-shaped recess 52 extends in the X-direction in a straight line and cross the plurality of semiconductor layers 34 as well as the plurality of pixel electrode layers 35 in a plan view.

As illustrated in FIG. 4, each of the plurality of pixel electrode layers 35 is disposed in a region defined, in a plan view, by the plurality of gate bus lines 32 and the plurality of source bus lines 33. Hereinafter, two of the plurality of pixel electrode layers 35 adjacent to each other in the Y-direction will be also referred to as a first pixel electrode layer 351 and a second pixel electrode layer 352, as necessary. As illustrated in FIG. 5, the second pixel electrode layer 352 is disposed on the upper surface of the second insulating layer 38. The plurality of pixel electrode layers 35 including the first pixel electrode layer 351 and second pixel electrode layer 352 shown in FIG. 4 are composed of a light-transparency conductor.

As illustrated in FIG. 5, the third insulating layer 39 is disposed on the second insulating layer 38 and pixel electrode layers 35. The common-electrode layer 40 is disposed on the third insulating layer 39. As illustrated in FIG. 1, the display device 1 is configured such that the alignment of the liquid crystal molecules within the liquid crystal layer 3 is controlled by an electric field generated by the pixel electrode layers 35 and common-electrode layer 40. The colors of light passing through each pixel corresponding to the liquid crystal layer 3 are accordingly combined, thus enabling the display device 1 to display any image.

As earlier described, the first semiconductor layer 341 includes the first portion 341a, the second portion 341b, and the third portion 341c. The first portion 341a extends in the Y-direction from where the first portion 341a is electrically connected to the second pixel electrode layer 352. The first portion 341a crosses the corresponding gate bus line 32 under the gate bus line 32. The second portion 341b extends in the Y-direction above the first source bus line 331 from where the second portion 341b is electrically connected to the first source bus line 331. The third portion 341c connects the first portion 341a and second portion 341b of the first semiconductor layer 341 together. The third portion 341c obliquely crosses the first pixel electrode layer 351 under the first pixel electrode layer 351. The first semiconductor layer 341 thus constitutes a TFT source region near the connection between the first semiconductor layer 341 and first source bus line 331 in a plan view. The first semiconductor layer 341 also constitutes a TFT drain region near the connection between the first semiconductor layer 341 and second pixel electrode layer 352 in a plan view. The first semiconductor layer 341 also constitutes a TFT channel region at the overlap between the first semiconductor layer 341 and gate bus line 32 in a plan view. The gate bus line 32 overlapping the first semiconductor layer 341 constitutes a TFT gate electrode.

In FIG. 4, where each of the plurality of gate bus lines 32 and each of the plurality of semiconductor layers 34 cross each other in a plan view constitutes the channel region of each of the plurality of semiconductor layers 34.

Figure 6:
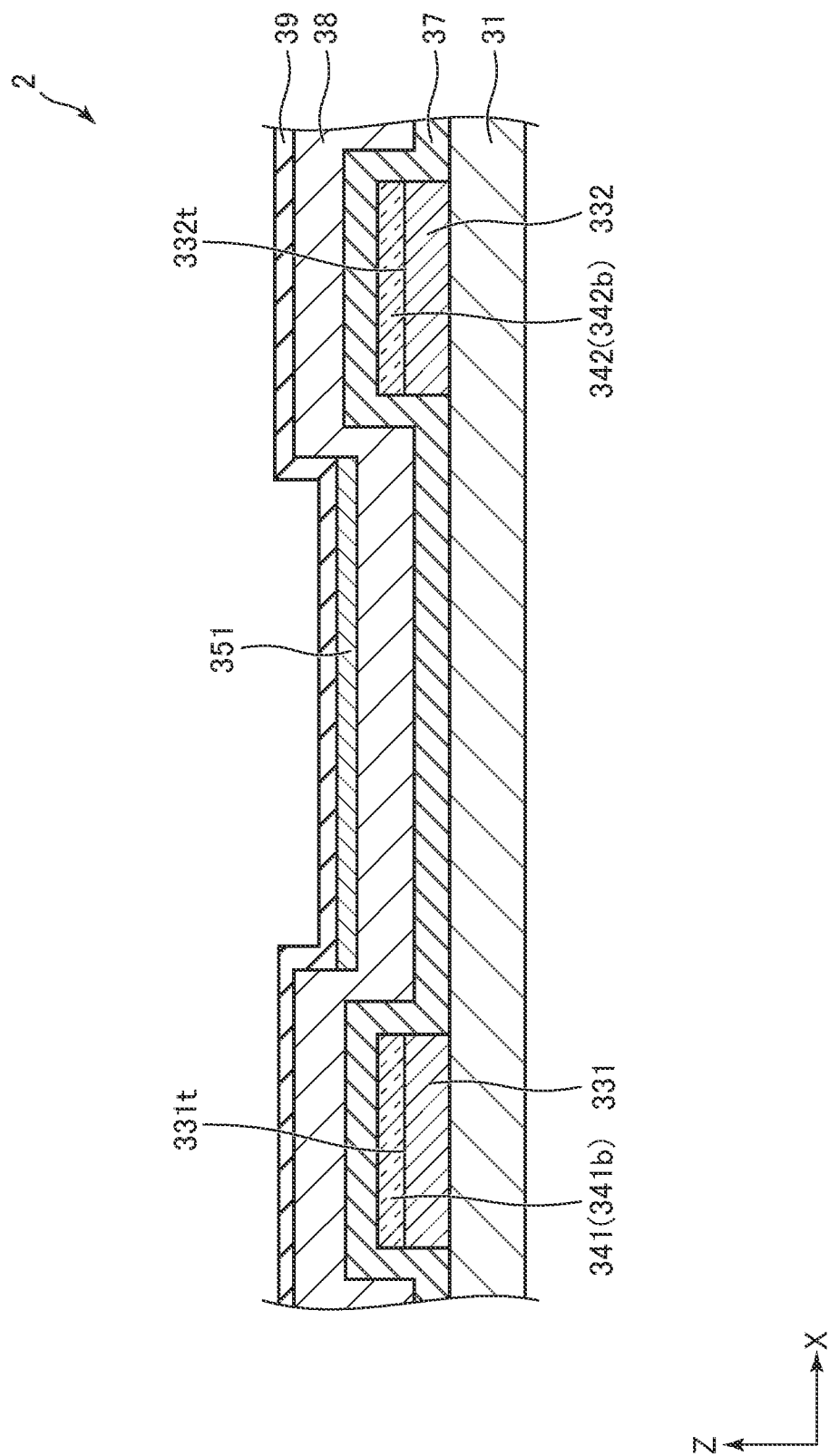
FIG. 6 is a sectional view taken along line V-V in FIG. 4.

The following details the configuration of the first groove-shaped recess 51. FIG. 6 is a sectional view taken along line V-V in FIG. 4. That is, FIG. 6 is a sectional view taken along the first groove-shaped recess 51 in the X-direction. The up-and-down direction in FIG. 6 indicates a Z-direction, which is orthogonal to the X-direction and the Y-direction. In the Specification, the foregoing the X-direction, the Y-direction, and the Z-direction coincide with each of the three axes of a rectangular coordinate system and are used in the same meanings as the foregoing meanings in any of the drawings.

Figure 7:
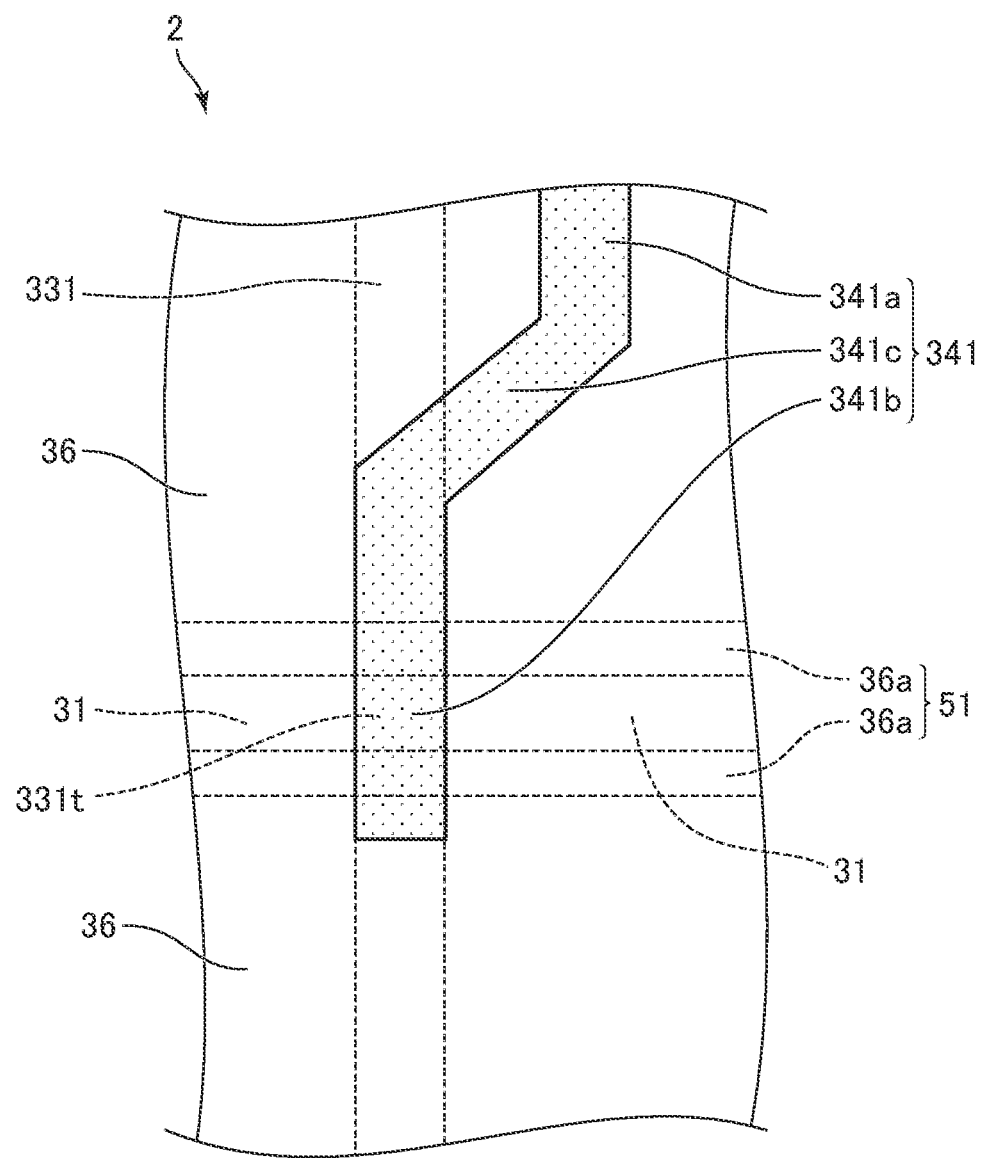
FIG. 7 is an enlarged plan view of a semiconductor layer and its vicinity shown in FIG. 4.

FIG. 7 illustrates the first insulating layer 36 and first semiconductor layer 341 positioned on the top with the layers including and above the gate insulating film 37 in FIG. 5 being omitted, and FIG. 7 is a plan view of the surroundings of the first groove-shaped recess 51. In FIG. 7, the first semiconductor layer 341 is indicated by a solid-line outline, and the first insulating layer 36 and the first source bus line 331 are indicated by dotted-line outlines. Also, in FIG. 7, the first semiconductor layer 341 is a region with dots.

As seen from FIG. 7, the second portion 341b of the first semiconductor layer 341 crosses the first groove-shaped recess 51 along the surface of the first groove-shaped recess 51. That is, as seen from FIGS. 6 and 7, the second portion 341b covers the upper surfaces of the walls 36a and an upper surface 331t of the first source bus line 331, and the upper surface 331t of the first source bus line 331 and the second portion 341b of the first semiconductor layer 341 are electrically connected together. Likewise, an upper surface 332t of the second source bus line 332 and the second portion 342b of the second semiconductor layer 342 are electrically connected together.

As seen from the foregoing description, the first groove-shaped recess 51 constitutes the first contact hole, and in a plan view, the source bus line 33 and semiconductor layer 34 overlapping each other in the up-and-down direction cross the first contact hole at the same location. The plurality of source bus lines 33 are thus electrically connected to the plurality of semiconductor layers 34 within the first contact hole. Such a configuration prevents poor connection, which is caused by poor opening in a contact hole, a lack of a material that is to be stacked within the contact hole, or other factors, when compared to a conventional configuration where a plurality of separated contact holes are bored at each of a plurality of electrical connections.

Figure 8:
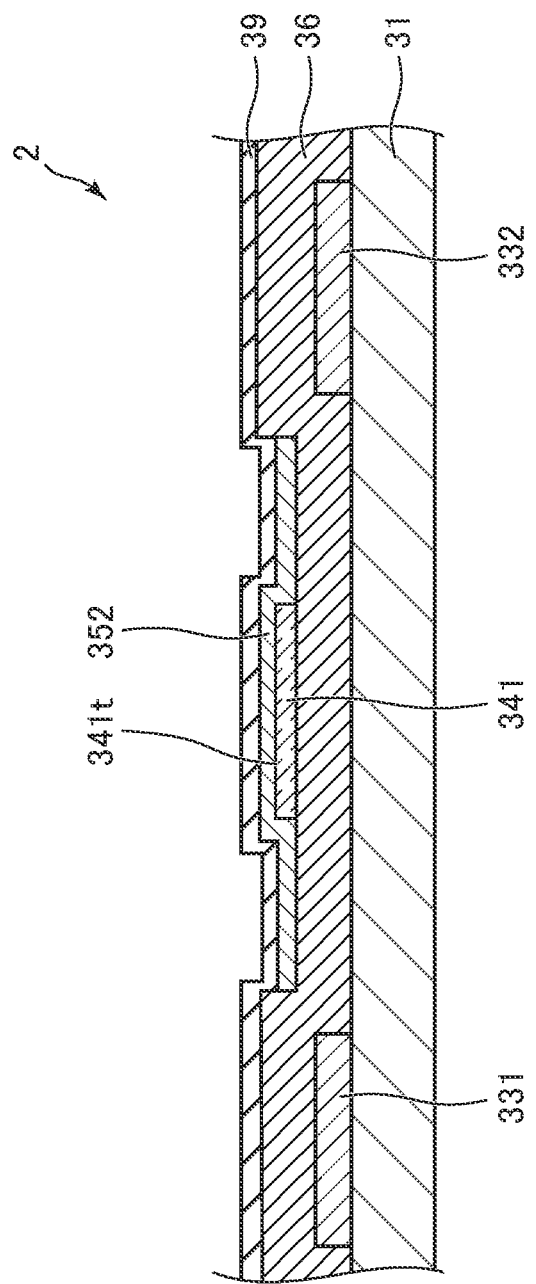
FIG. 8 is a sectional view taken along line VII-VII in FIG. 4.

The following details the configuration of the second groove-shaped recess 52. FIG. 8 is a sectional view taken along line VII-VII in FIG. 4. That is, FIG. 8 is a sectional view taken along the second groove-shaped recess 52 in the X-direction.

Figure 9:
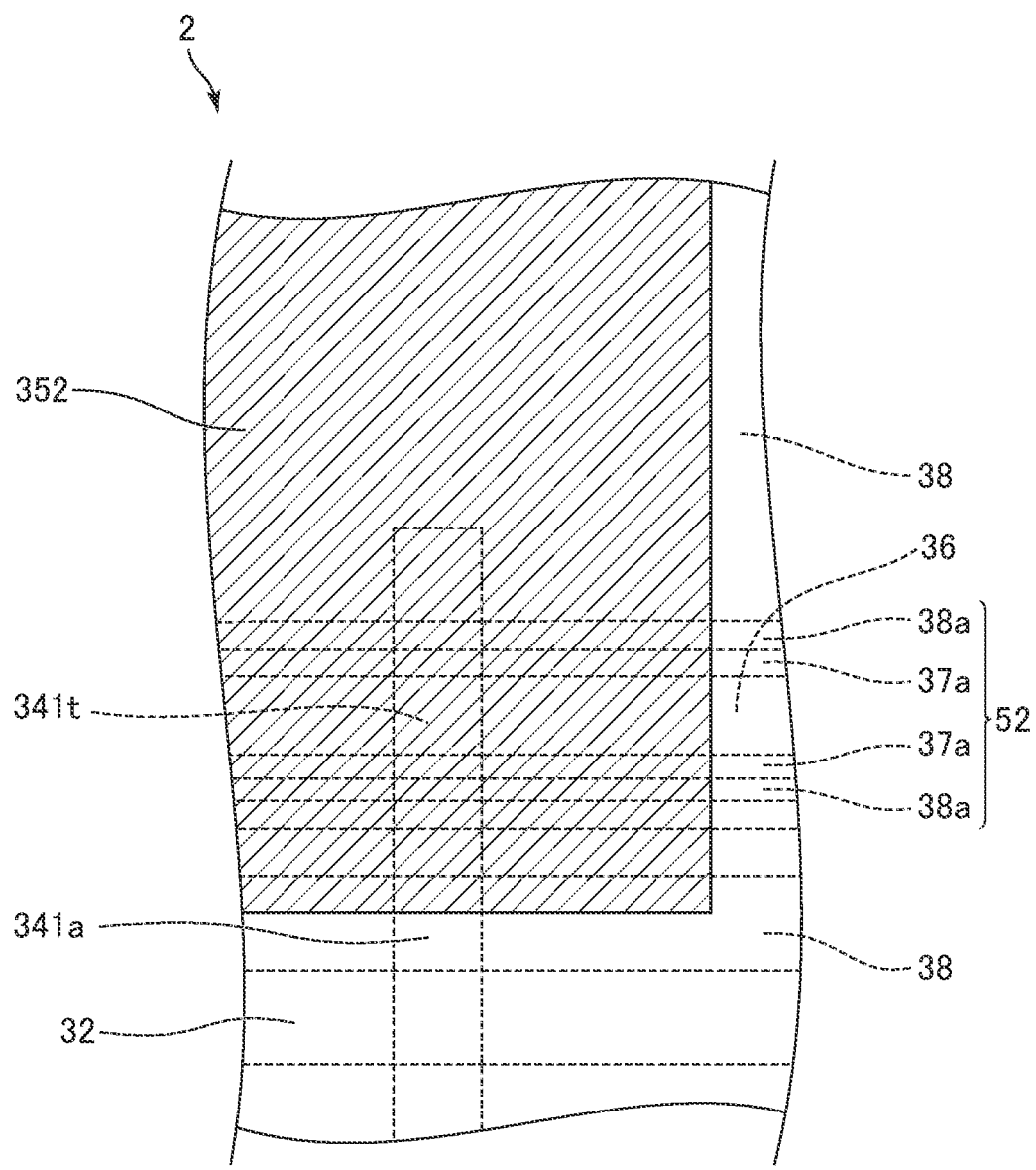
FIG. 9 is a partially enlarged plan view of a second groove-shaped recess and its vicinity shown in FIG. 4.

FIG. 9 is a plan view of a configuration where the second pixel electrode layer 352 is positioned on the top with the layers including and above the third insulating layer 39 in FIG. 5 being omitted, and with the layers including and under the first source bus line 331 in FIG. 5 being omitted. In other words, FIG. 9 is a plan view of the surroundings of the second groove-shaped recess 52 with the first insulating layer 36 being the lowermost layer. In FIG. 9, the second pixel electrode layer 352 is indicated by a solid-line outline, and the components other than the second pixel electrode layer 352 are indicated by dotted-line outlines. Also, in FIG. 9, the second pixel electrode layer 352 is a region with oblique lines.

As seen from FIG. 9, the second pixel electrode layer 352 crosses the second groove-shaped recess 52 along the surface of the second groove-shaped recess 52. That is, as seen from FIGS. 8 and 9, the second pixel electrode layer 352 covers the upper surfaces of the walls 38a and 37a, the upper surface of the first portion 341a of the first semiconductor layer 341, and the upper surface of the first insulating layer 36; in addition, an upper surface 341t of the first portion 341a of the first semiconductor layer 341 and the second pixel electrode layer 352 are electrically connected together.

As seen from the foregoing description, the second groove-shaped recess 52 constitutes the second contact hole, and in a plan view, the pixel electrode layer 35 and semiconductor layers 34 overlapping each other in the up-and-down direction cross the second contact hole at the same location. The plurality of pixel electrode layers 35 are thus electrically connected to the plurality of semiconductor layers 34 within the second contact hole. Such a configuration prevents poor connection, which is caused by poor opening in a contact hole, a lack of a material that is to be stacked within the contact hole, or other factors, when compared to a conventional configuration where a plurality of separated contact holes are bored at each of a plurality of electrical connections.

Second Preferred Embodiment

Figure 10:
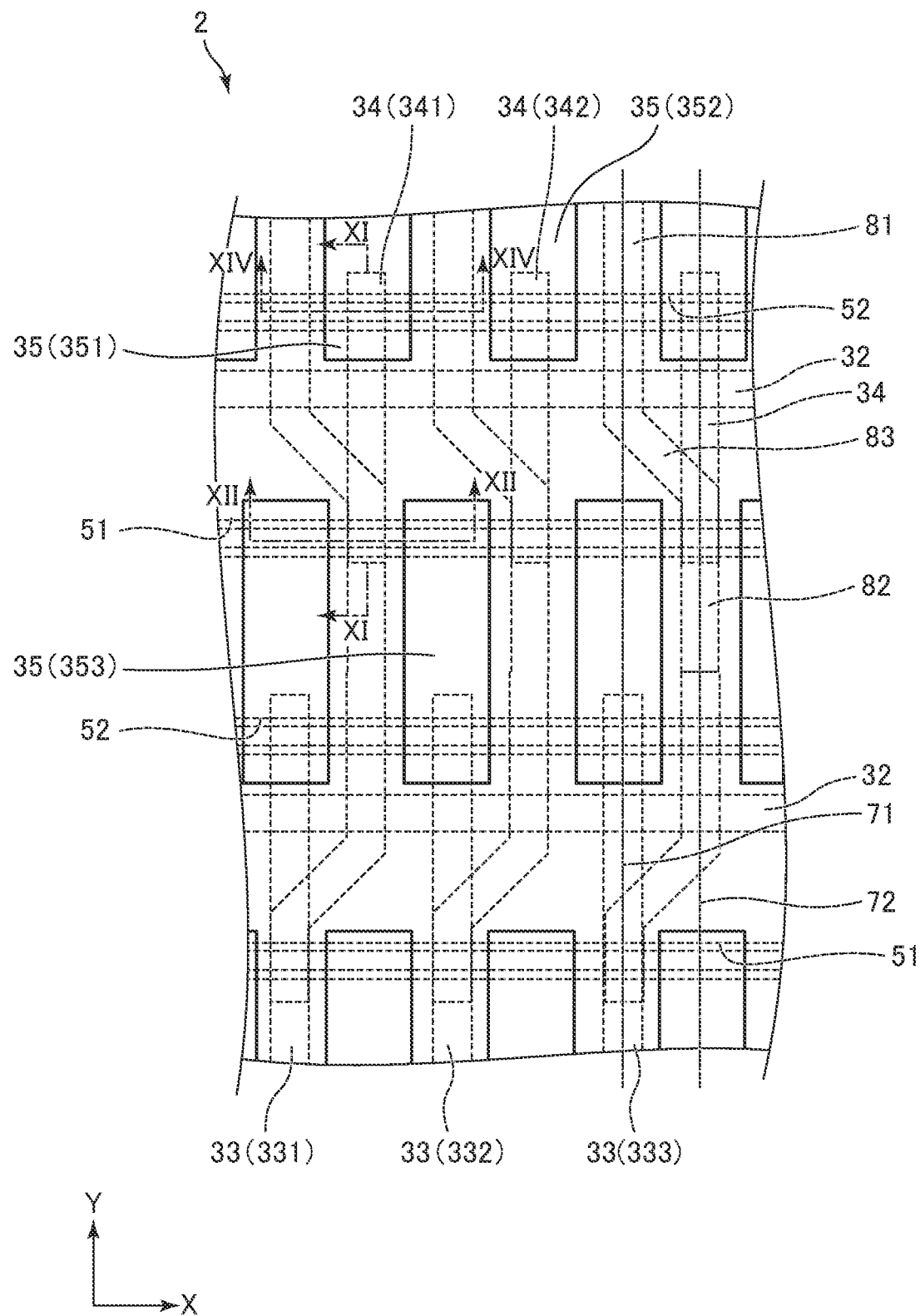
FIG. 10 is a plan view of part of an active-matrix substrate in a second preferred embodiment.
Figure 11:
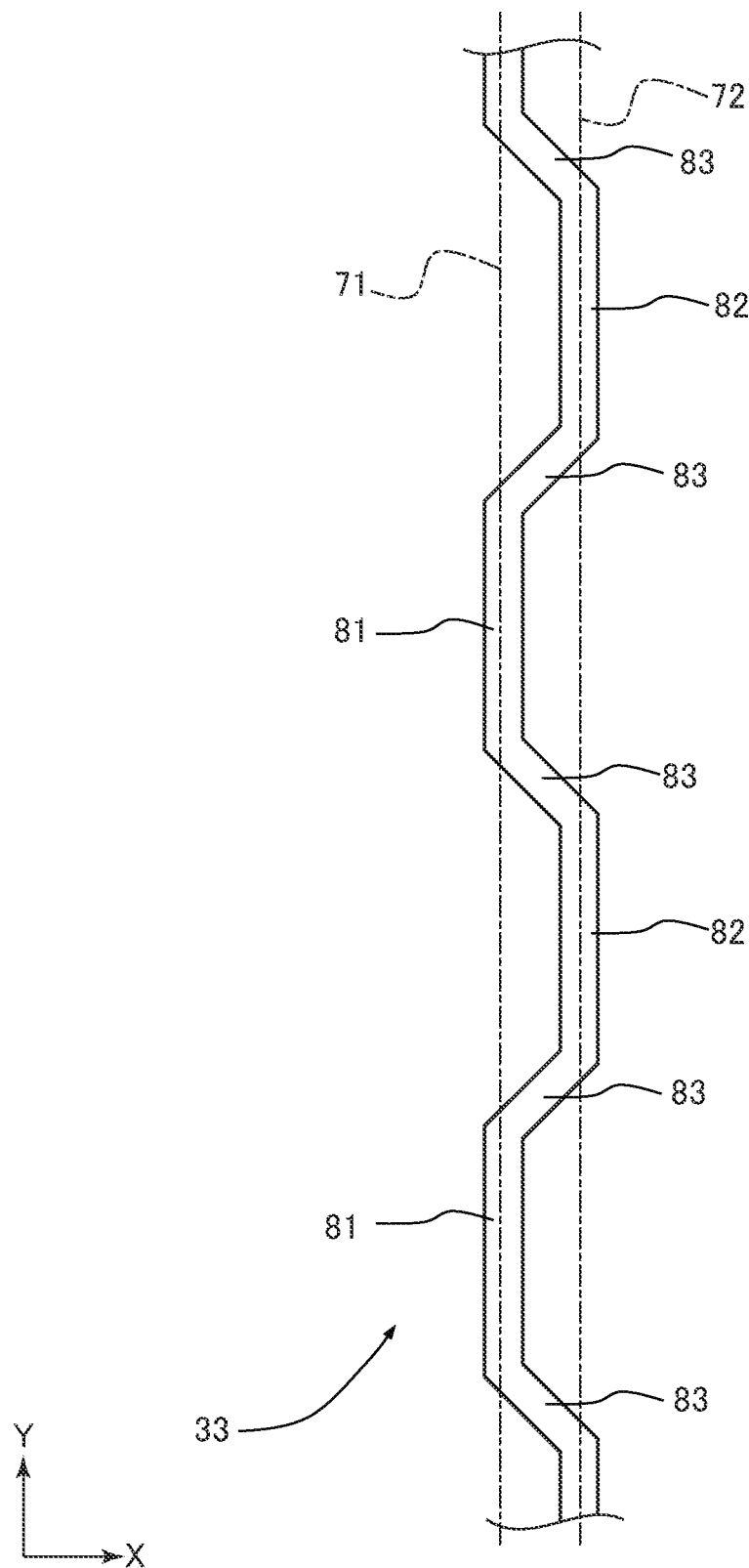
FIG. 11 is a plan view of a source bus line in the second preferred embodiment.
Figure 12:
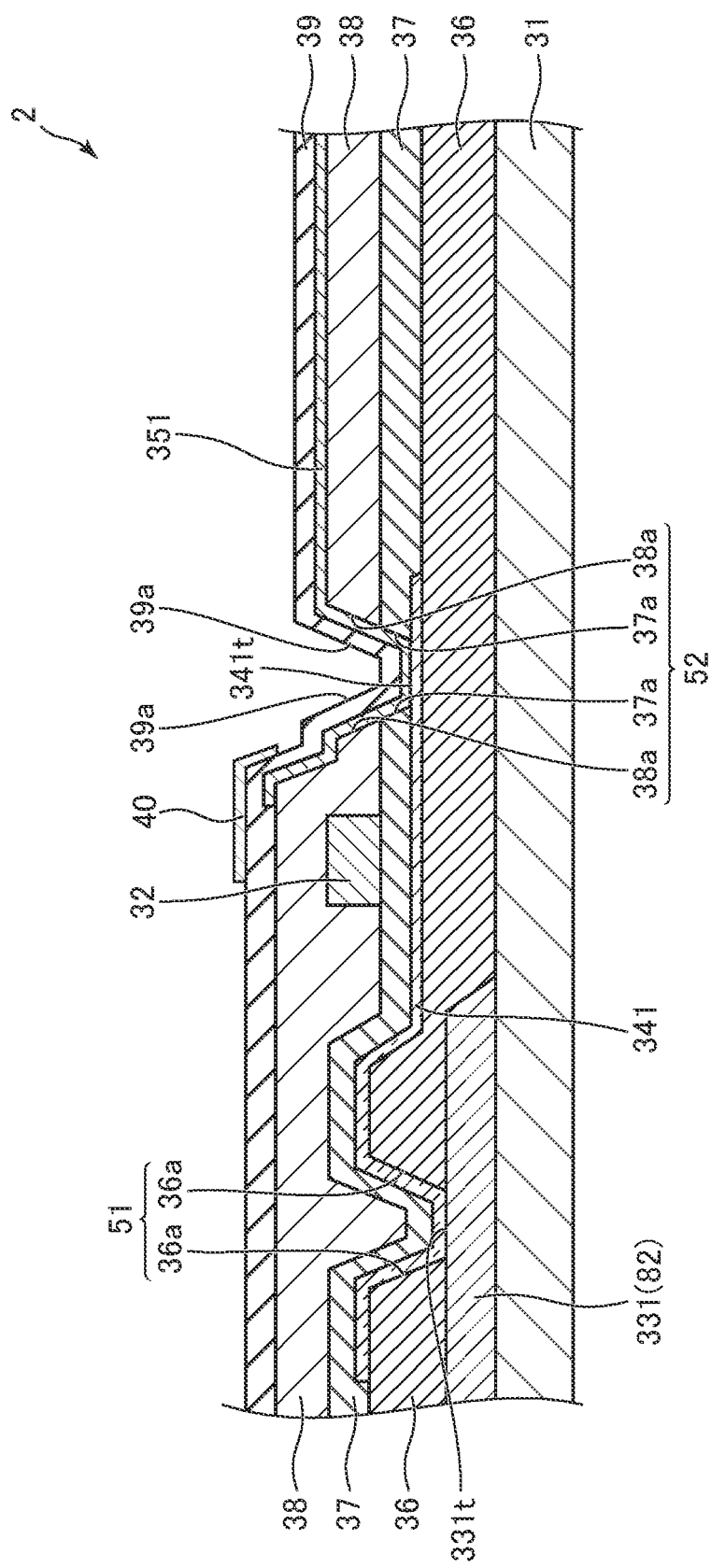
FIG. 12 is a sectional view taken along line XI-XI in FIG. 10.

A second preferred embodiment of the present disclosure will be described. The second preferred embodiment of the present disclosure is different from the first preferred embodiment in mainly the shape of the plurality of source bus lines 33 and the shape of the plurality of semiconductor layers 34. The description of particulars common to those in the first preferred embodiment will be omitted, as appropriate. FIG. 10 is a plan view of part of the active-matrix substrate 2 in the second preferred embodiment of the present disclosure. FIG. 11 is a plan view of one of the plurality of source bus lines 33 shown in FIG. 10. FIG. 12 is a sectional view taken along line XI-XI in FIG. 10.

As illustrated in FIG. 10, the active-matrix substrate 2 in the second preferred embodiment has the substrate 31, the plurality of gate bus lines 32, the plurality of source bus lines 33, the plurality of semiconductor layers 34, and the plurality of pixel electrode layers 35. FIG. 10 is a plan view of a configuration where the pixel electrode layers 35 are positioned on the top with the third insulating layer 39 and common-electrode layer 40 in FIG. 12 being omitted. In FIG. 10, the pixel electrode layers 35 are indicated by solid-line outlines, and components closer to the substrate 31 than the pixel electrode layers 35 are indicated by dotted-line outlines. FIGS. 10 and 11 show a first virtual straight line 71 and a second virtual straight line 72, both indicated by dot-dashed lines; here, these straight lines are reference lines that are used for positioning and are thus not actual lines.

As illustrated in FIG. 10, the plurality of source bus lines 33 are arranged in parallel in the X-direction at spacing. The plurality of source bus lines 33 are arranged in the X-direction in such a manner that each of a plurality of first straight portions 81, each of a plurality of second straight portions 82, and each of a plurality of connecting portions 83 are adjacent to each other. Hereinafter, three of the plurality of source bus lines 33 adjacent to each other in the X-direction will be also referred to as a first source bus line 331, a second source bus line 332, and a third source bus line 333, as necessary.

As illustrated in FIG. 10, each of the plurality of pixel electrode layers 35 is disposed in a region defined, in a plan view, by the plurality of gate bus lines 32 and the plurality of source bus lines 33. Hereinafter, three of the plurality of pixel electrode layers 35 will be also referred to as the first pixel electrode layer 351, the second pixel electrode layer 352, and a third pixel electrode layer 353, as necessary. Here, the first pixel electrode layer 351 is adjacent to the second straight portion 82 of the first source bus line 331 in the Y-direction; in addition, the second pixel electrode layer 352 is adjacent to the first straight portion 81 of the first source bus line 331 in the Y-direction; in addition, the third pixel electrode layer 353 is adjacent to the first straight portion 81 of the second source bus line 332 in the Y-direction.

As illustrated in FIG. 10, the plurality of semiconductor layers 34 in the second preferred embodiment each extend in the Y-direction in a straight line. Hereinafter, two of the plurality of semiconductor layers 34 adjacent to each other in the X-direction will be also referred to as the first semiconductor layer 341 and the second semiconductor layer 342, as necessary. As seen from FIGS. 10 and 12, the first semiconductor layer 341 is disposed above and overlaps, near one of its ends, the second straight portion 82 of the first source bus line 331; in addition, the first semiconductor layer 341 is disposed under and overlaps, near the other one of its ends, the first pixel electrode layer 351. Moreover, the second semiconductor layer 342 is disposed above and overlaps, near one of its ends, the second straight portion 82 of the second source bus line 332; in addition, the second semiconductor layer 342 is disposed under and overlaps, near the other one of its ends, the second pixel electrode layer 352.

As illustrated in FIG. 10, the plurality of gate bus lines 32 extend in the X-direction in a plan view. The plurality of gate bus lines 32 are arranged in parallel in the Y-direction at spacing. Herein, as illustrated in FIG. 11, the source bus lines 33 are each serpentine in the Y-direction. As illustrated in FIG. 10, the plurality of gate bus lines 32 each cross the plurality of source bus lines 33 and the plurality of semiconductor layers 34. The plurality of gate bus lines 32 cross, in the Y-direction, the plurality of first straight portions 81 and the plurality of second straight portions 82 alternately in a plan view.

As illustrated in FIG. 11, each source bus line 33 in the second preferred embodiment includes the plurality of first straight portions 81, the plurality of second straight portions 82, and the plurality of connecting portions 83. Each of the plurality of connecting portions 83 connects together an end of a corresponding one of the plurality of first straight portions 81 and an end of a corresponding one of the plurality of second straight portions 82. These ends are adjacent to each other. As illustrated in FIGS. 10 and 12, the source bus lines 33 are disposed on the upper surface of the substrate 31. The plurality of first straight portions 81 are arranged at spacing on the first virtual straight line 71, which extends in the Y-direction. The plurality of second straight portions 82 are arranged at spacing on the second virtual straight line 72, which extends in the Y-direction in parallel to the first virtual straight line 71. The first virtual straight line 71 and the second virtual straight line 72 are arranged in parallel in the X-direction at spacing. The plurality of first straight portions 81 and the plurality of second straight portions 82 are alternately arranged in the Y-direction.

The plurality of semiconductor layers 34 in the second preferred embodiment each have a simple straight-line shape, as illustrated in FIG. 10, and the plurality of source bus lines 33 each have such a relatively complex shape as to be bent repeatedly in a plan view, as illustrated in FIG. 11. The plurality of semiconductor layers 34 are made of a semiconductor material, such as an oxide semiconductor. Oxide semiconductors often undergo processing through wet etching; hence, an oxide semiconductor having a simple shape is likely to undergo processing accurately. The plurality of source bus lines 33 are made of a typical metal material, such as aluminum or copper. The source bus lines 33 often undergo processing through dry etching; hence even the source bus lines 33 each having a complex shape are likely to undergo processing accurately. Thus, the material of the source bus lines 33 is easier to process than the material of the semiconductor layers 34; hence, the shape of the active-matrix substrate 2 has high accuracy after the processing. The shape of the active-matrix substrate 2 thus has more improved accuracy in the configuration in the second preferred embodiment than that in the configuration in the first preferred embodiment, thus keeping the display quality of the display device 1 high.

As seen from FIGS. 10 and 12, bored in the first insulating layer 36 in the second preferred embodiment is the first groove-shaped recess 51, which constitutes the first contact hole extending from above to the first source bus line 331. To be specific, the first insulating layer 36 undergoes partial removal, thus forming the two walls 36a extending in parallel in the X-direction. The two walls 36a face each other in the Y-direction. As illustrated in FIG. 10, the first groove-shaped recess 51 extends in the X-direction in a straight line and cross the plurality of source bus lines 33 as well as the plurality of semiconductor layers 34 in a plan view. The plurality of first groove-shaped recesses 51 cross, in the Y-direction, the plurality of first straight portions 81 and the plurality of second straight portions 82 alternately in a plan view.

As illustrated in FIG. 12, bored in the gate insulating film 37 and second insulating layer 38 is the second groove-shaped recess 52, which constitutes the second contact hole extending from above to the first semiconductor layer 341.

In FIG. 10, where each of the plurality of gate bus lines 32 and each of the plurality of semiconductor layers 34 cross each other in a plan view constitutes the channel region of each of the plurality of semiconductor layers 34.

Figure 13:
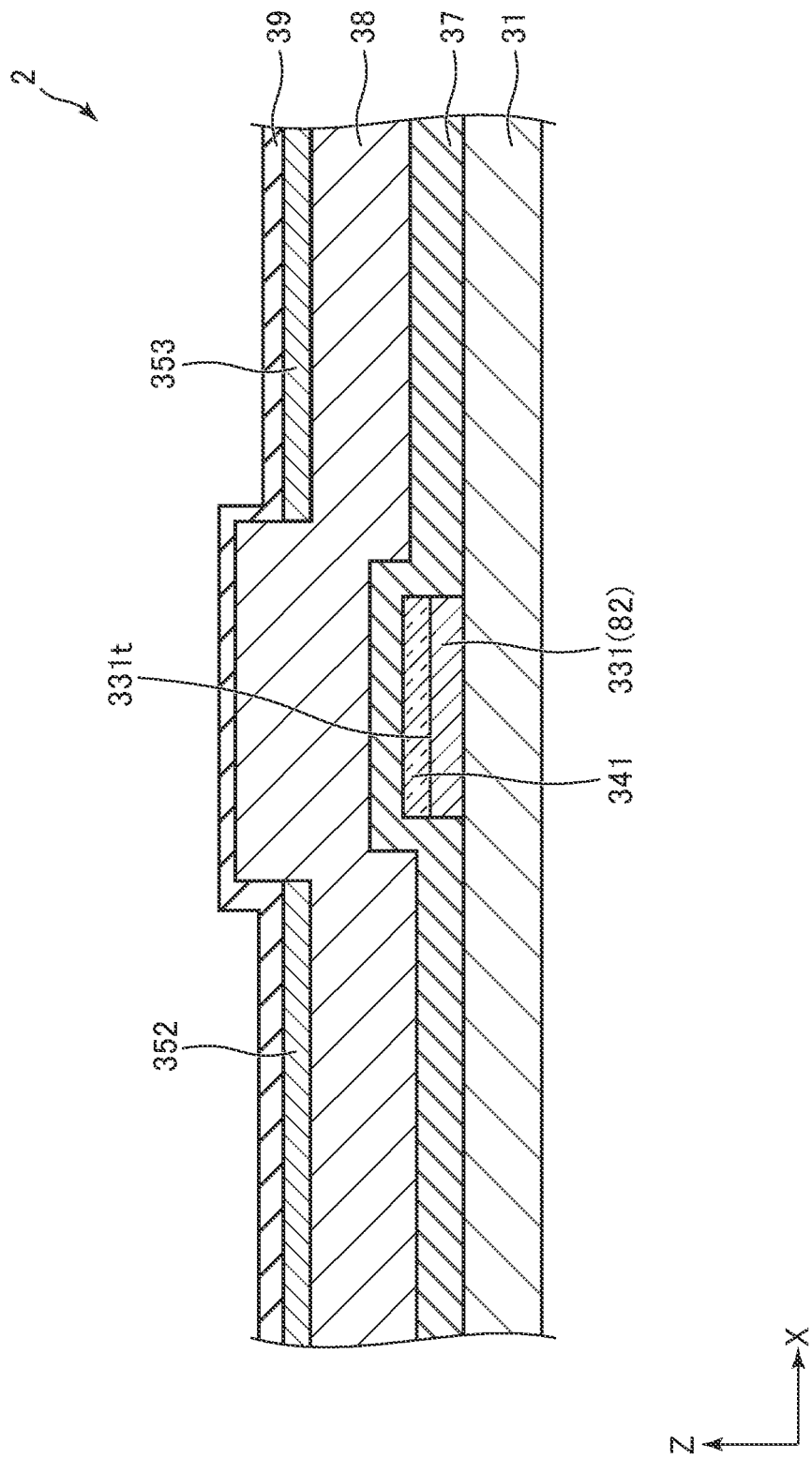
FIG. 13 is a sectional view taken along line XII-XII in FIG. 10.

The following details the configuration of the first groove-shaped recess 51 in the second preferred embodiment. FIG. 13 is a sectional view taken along line XII-XII in FIG. 10.

That is, FIG. 13 is a sectional view taken along the first groove-shaped recess 51 in the X-direction.

Figure 14:
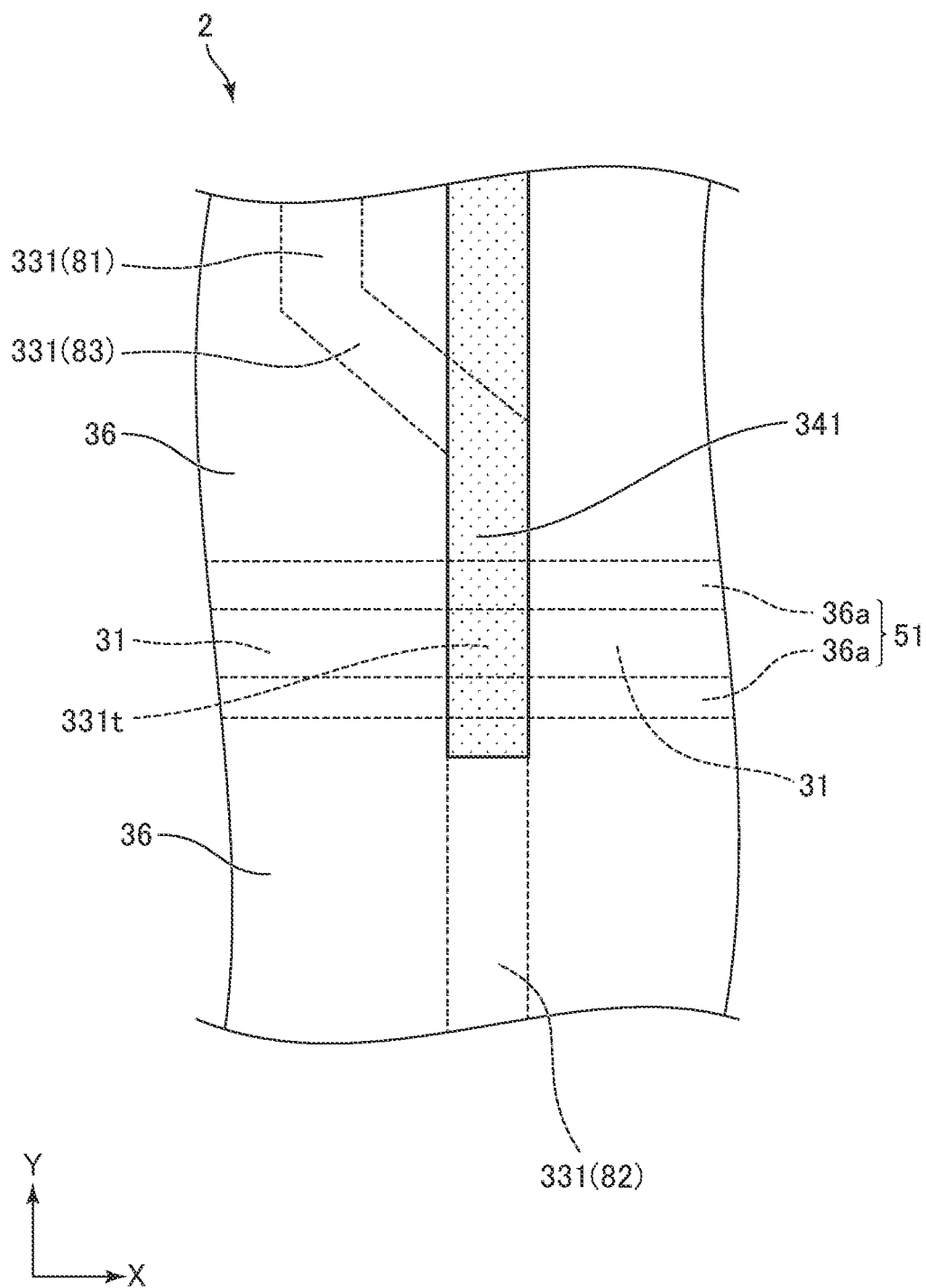
FIG. 14 is an enlarged plan view of a semiconductor layer and its vicinity shown in FIG. 10.

FIG. 14 illustrates the first semiconductor layer 341 positioned on the top with the layers including and above the gate insulating film 37 in FIG. 12 being omitted, and FIG. 14 is a plan view of the surroundings of the first groove-shaped recess 51. In FIG. 14, the first semiconductor layer 341 is indicated by a solid-line outline, and the first source bus line 331 is indicated by a dotted-line outline. Also, in FIG. 14, the first semiconductor layer 341 is a region with dots.

As seen from FIG. 14, the first semiconductor layer 341 extends along the surface of the first groove-shaped recess 51 and crosses the first groove-shaped recess 51. That is, as seen from FIGS. 13 and 14, the first semiconductor layer 341 extends, near its lower part in the Y-direction, along the upper surface of one of the walls 36a, the upper surface 331t of the second straight portion 82 of the first source bus line 331, and the upper surface of the other wall 36a. As seen from FIGS. 13 and 14, the upper surface 331t of the second straight portion 82 of the first source bus line 331 and the vicinity of the lower part of the first semiconductor layer 341 in the Y-direction are electrically connected together within the first groove-shaped recess 51.

As seen from the foregoing description, the first groove-shaped recess 51 constitutes the first contact hole, and in a plan view, the source bus line 33 and semiconductor layer 34 overlapping each other in the up-and-down direction cross the first contact hole at the same location. The plurality of source bus lines 33 are thus electrically connected to the plurality of semiconductor layers 34 within the first contact hole. Such a configuration can prevent poor connection, which is caused by poor opening in a contact hole, a lack of a material that is to be stacked within the contact hole, or other factors, when compared to a conventional configuration where a plurality of separated contact holes are bored at each of a plurality of electrical connections.

Figure 15:
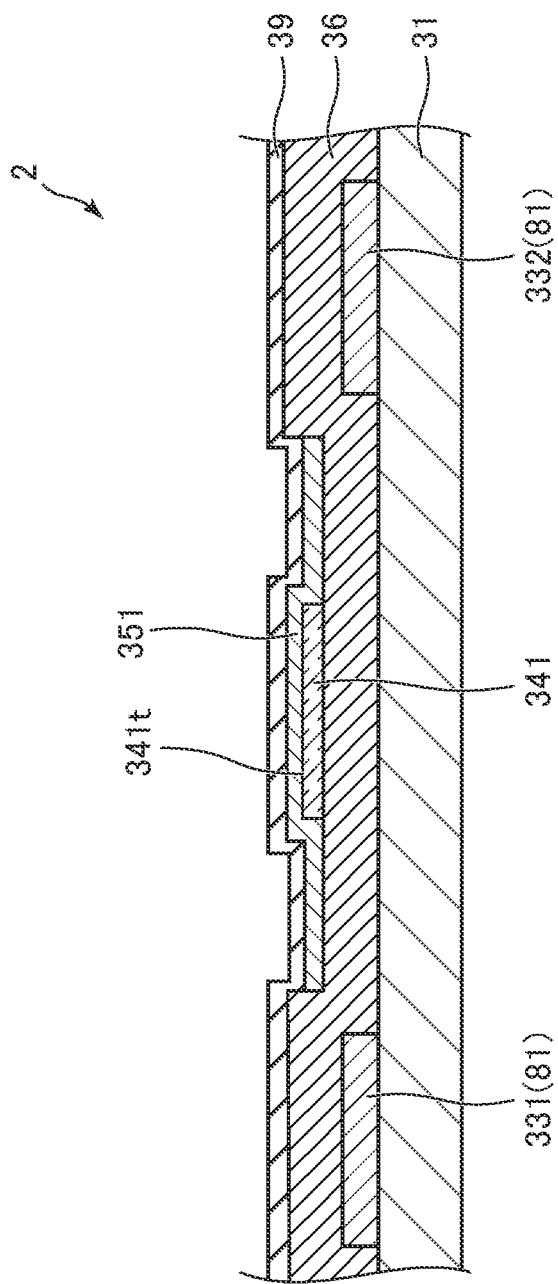
FIG. 15 is a sectional view taken along line XIV-XIV in FIG. 10.

The following details the configuration of the second groove-shaped recess 52. FIG. 15 is a sectional view taken along line XIV-XIV in FIG. 10. That is, FIG. 15 is a sectional view taken along the second groove-shaped recess 52 in the X-direction.

Figure 16:
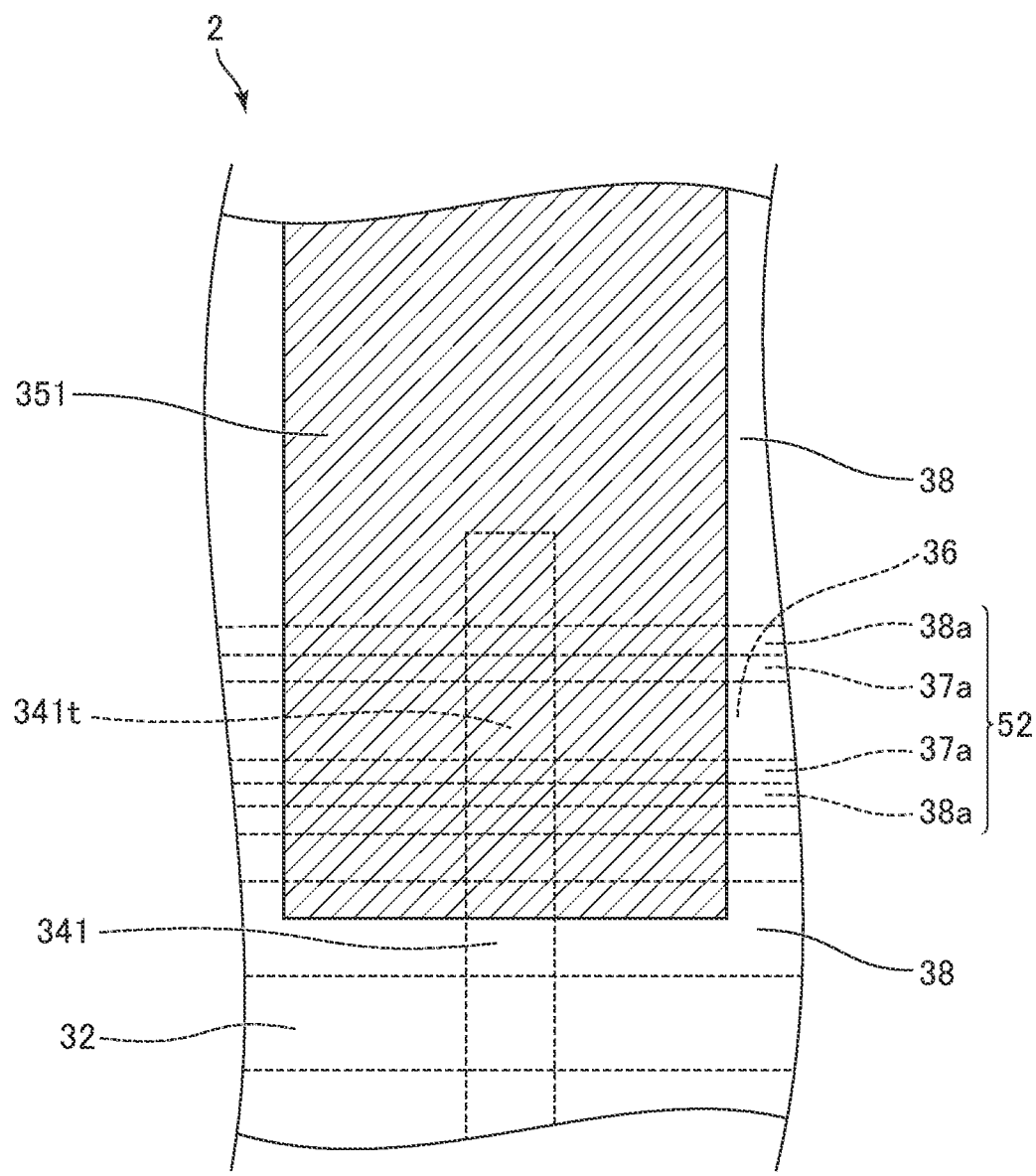
FIG. 16 is an enlarged plan view of the second groove-shaped recess and its vicinity shown in FIG. 10.

FIG. 16 is a plan view of a configuration where the first pixel electrode layer 351 are positioned on the top with the layers including and above the third insulating layer 39 in FIG. 12 being omitted, and with the layers including and under the first source bus line 331 in FIG. 12 being omitted. In other words, FIG. 16 is a plan view of the surroundings of the second groove-shaped recess 52 with the first insulating layer 36 being the lowermost layer. In FIG. 16, the first pixel electrode layer 351 is indicated by a solid-line outline, and the components other than the first pixel electrode layer 351 are indicated by dotted-line outlines. Also, in FIG. 16, the first pixel electrode layer 351 is a region with oblique lines.

As seen from FIG. 16, the first pixel electrode layer 351 extends along the surface of the second groove-shaped recess 52 and crosses the second groove-shaped recess 52. That is, as seen from FIGS. 15 and 16, the first pixel electrode layer 351 covers the upper surfaces of the walls 38a and 37a, the upper surface 341t of the first semiconductor layer 341 near its upper part in the Y-direction, and the upper surface of the first insulating layer 36; in addition, the upper surface 341t of the first semiconductor layer 341 near its upper part in the Y-direction and the first pixel electrode layer 351 are electrically connected together.

As seen from the foregoing description, the second groove-shaped recess 52 constitutes the second contact hole, and the plurality of pixel electrode layers 35 are electrically connected to the plurality of semiconductor layers 34 via the second contact hole. Such a configuration can prevent poor connection, which is caused by poor opening in a contact hole, a lack of a material that is to be stacked within the contact hole, or other factors, when compared to a conventional configuration where a plurality of separated contact holes are bored at each of a plurality of electrical connections.

Third Preferred Embodiment

Figure 17:
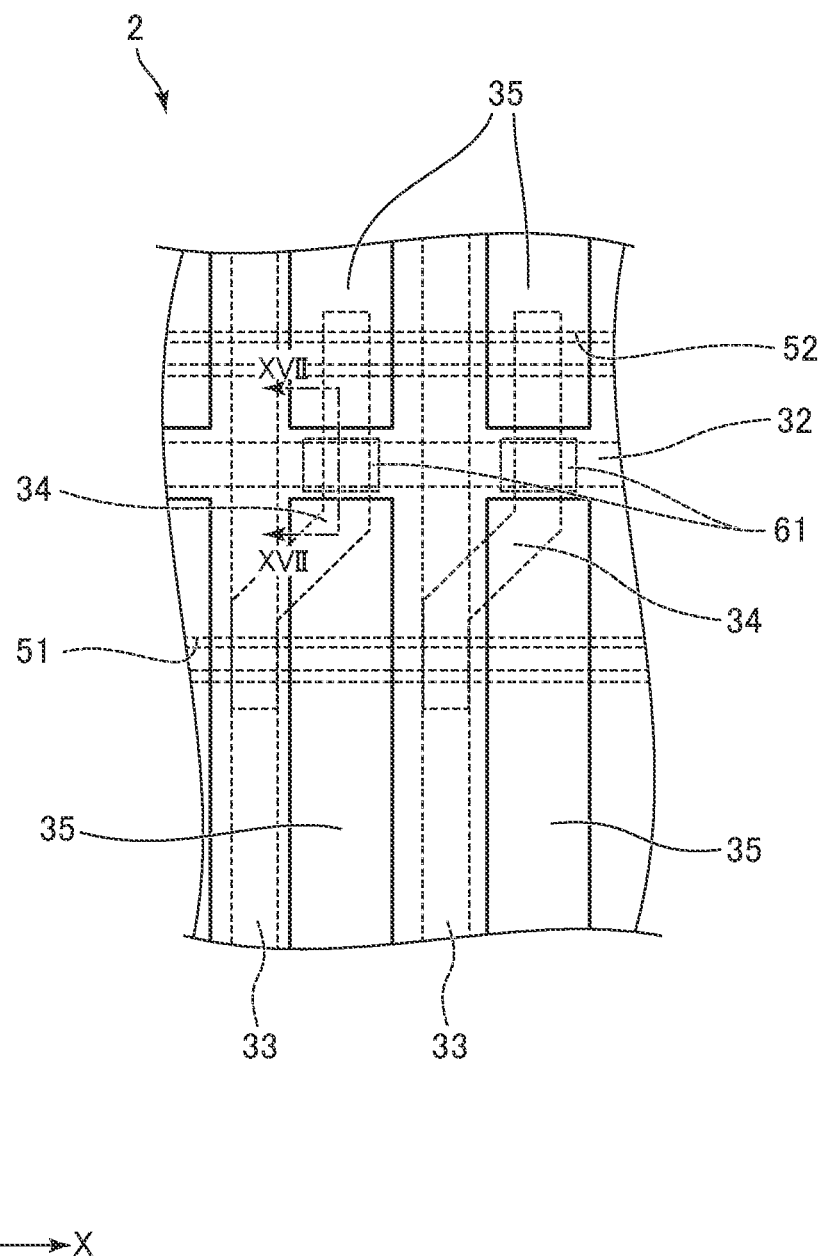
FIG. 17 is a plan view of part of an active-matrix substrate in a third preferred embodiment.
Figure 18:
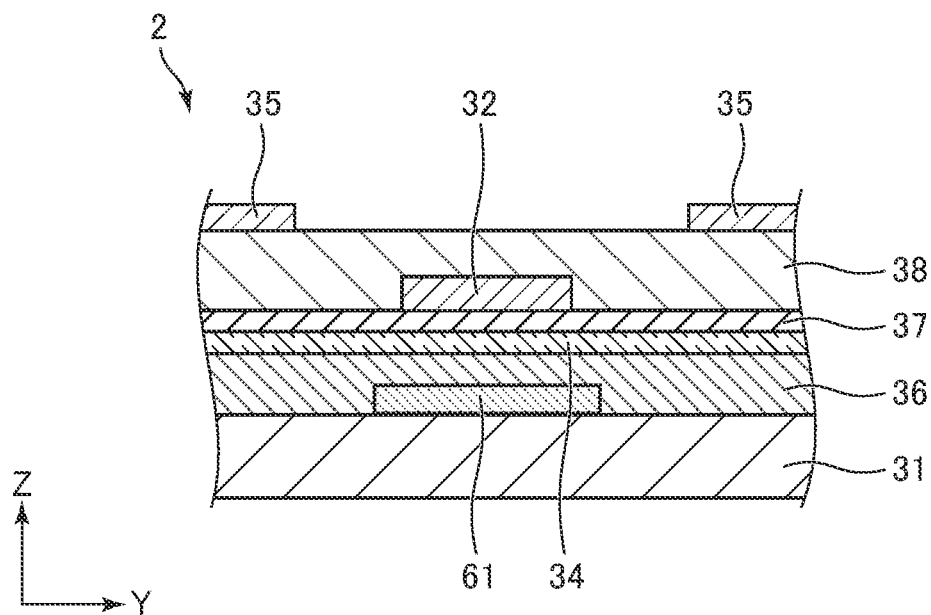
FIG. 18 is a sectional view taken along line XVII-XVII in FIG. 17.

A third preferred embodiment of the present disclosure will be described. The description of particulars common to those in the foregoing preferred embodiments will be omitted as appropriate. FIG. 17 is a plan view of part of the active-matrix substrate 2 in the third preferred embodiment of the present disclosure. FIG. 18 is a sectional view taken along line XVII-XVII in FIG. 17. FIG. 17 is a plan view of a configuration where the pixel electrode layers 35 are positioned on the top with the third insulating layer 39 and common-electrode layer 40 being omitted.

In the third preferred embodiment, a plurality of light-blocking layers 61 are disposed at a plurality of locations where the plurality of gate bus lines 32 and the plurality of semiconductor layers 34 cross each other, as illustrated in FIG. 17. Where the gate bus line 32 and the semiconductor layer 34 cross each other in a plan view constitutes the channel region of the semiconductor layer 34. Each light-blocking layer 61 in FIG. 17 overlaps, in a plan view, the corresponding semiconductor layer 34 including its channel region. The light-blocking layers 16 are provided for avoiding light emitted from the light source 5 toward the active-matrix substrate 2 from entrance into the vicinity of the channel regions of the semiconductor layers 34. The light-blocking layers 61 are preferably made of a material having low light transparency, such as metal.

The active-matrix substrate 2 in the third preferred embodiment is used in the display device 1 shown in FIG. 1 of the present disclosure. As seen from FIGS. 1 and 18, the light source 5 is disposed under the active-matrix substrate 2, and light is emitted upward from under the active-matrix substrate 2. In the active-matrix substrate 2 in the third preferred embodiment, the light-blocking layers 61 may be disposed in any of the plurality of layers constituting the active-matrix substrate 2 as long as each light-blocking layer 61 is disposed between the light source 5 and the corresponding semiconductor layer 34. FIG. 18 illustrates the light-blocking layer 61 disposed on the substrate 31, which is in the same layer as the source bus lines 33, and disposed under part of the semiconductor layer 34 and under the gate bus line 32. Light incident from under the active-matrix substrate 2 is blocked by the light-blocking layer 61 and does not thus enter the channel region of the semiconductor layer 34, which is disposed above the light-blocking layer 61. The light-blocking layers 61 can thus prevent degradation in the performance of the semiconductor layers 34 resulting from optical deterioration of the semiconductor layers 34.

Fourth Preferred Embodiment

Figure 19:
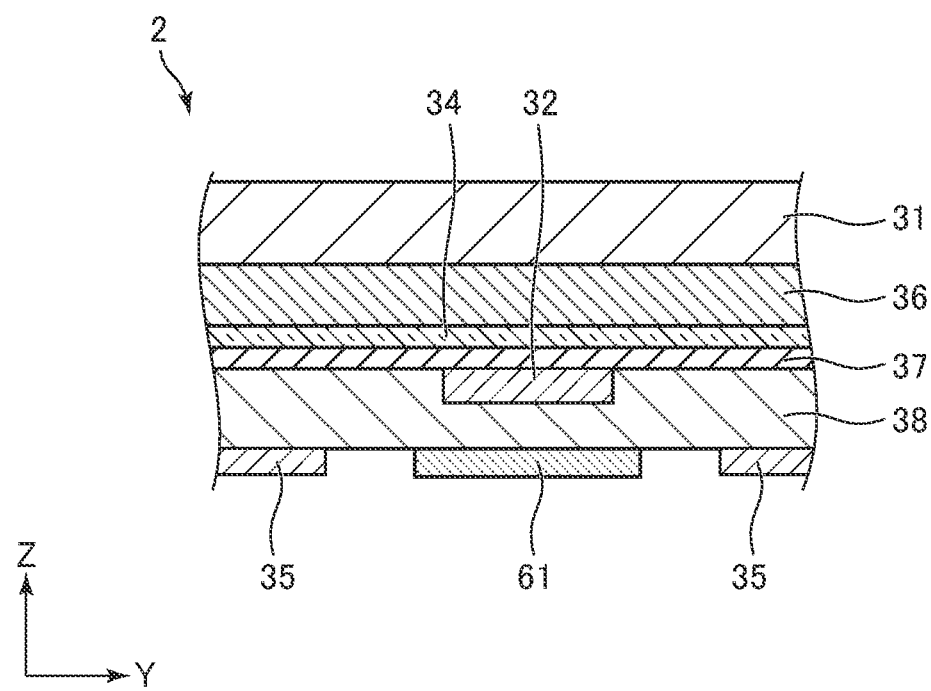
FIG. 19 is a sectional view of part of an active-matrix substrate in a fourth preferred embodiment.

A fourth preferred embodiment of the present disclosure will be described. FIG. 19 is a sectional view of part of the active-matrix substrate 2 in the fourth preferred embodiment of the present disclosure. As seen from FIGS. 18 and 19, turning the active-matrix substrate 2 in the third preferred embodiment upside down constitutes the active-matrix substrate 2 in the fourth preferred embodiment, where each light-blocking layer 61 is disposed at a different location. In the fourth preferred embodiment, the light-blocking layer 61 is disposed at a plurality of locations where the plurality of gate bus lines 32 and the plurality of semiconductor layers 34 cross each other. The light-blocking layer 61 overlaps, in a plan view, the semiconductor layer 34 including its channel region.

The active-matrix substrate 2 in the fourth preferred embodiment is used in the display device 1 shown in FIG. 2 of the present disclosure. As seen from FIGS. 2 and 19, the light source 5 is disposed under the active-matrix substrate 2, and light is emitted upward from under the active-matrix substrate 2. In the active-matrix substrate 2 in the fourth preferred embodiment, the light-blocking layers 61 may be disposed in any of the plurality of layers constituting the active-matrix substrate 2 as long as each light-blocking layer 61 is disposed between the light source 5 and the corresponding semiconductor layer 34. FIG. 19 illustrates the light-blocking layer 61 disposed on the lower surface of the second insulating layer 38, which is in the same layer as the pixel electrode layers 35. Light incident from under the active-matrix substrate 2 is blocked by the light-blocking layer 61 and does not thus enter the channel region of the semiconductor layer 34, which is disposed above the light-blocking layer 61. The light-blocking layers 61 can thus prevent degradation in the performance of the semiconductor layers 34 resulting from optical deterioration of the semiconductor layers 34.

Fifth Preferred Embodiment

Figure 20:
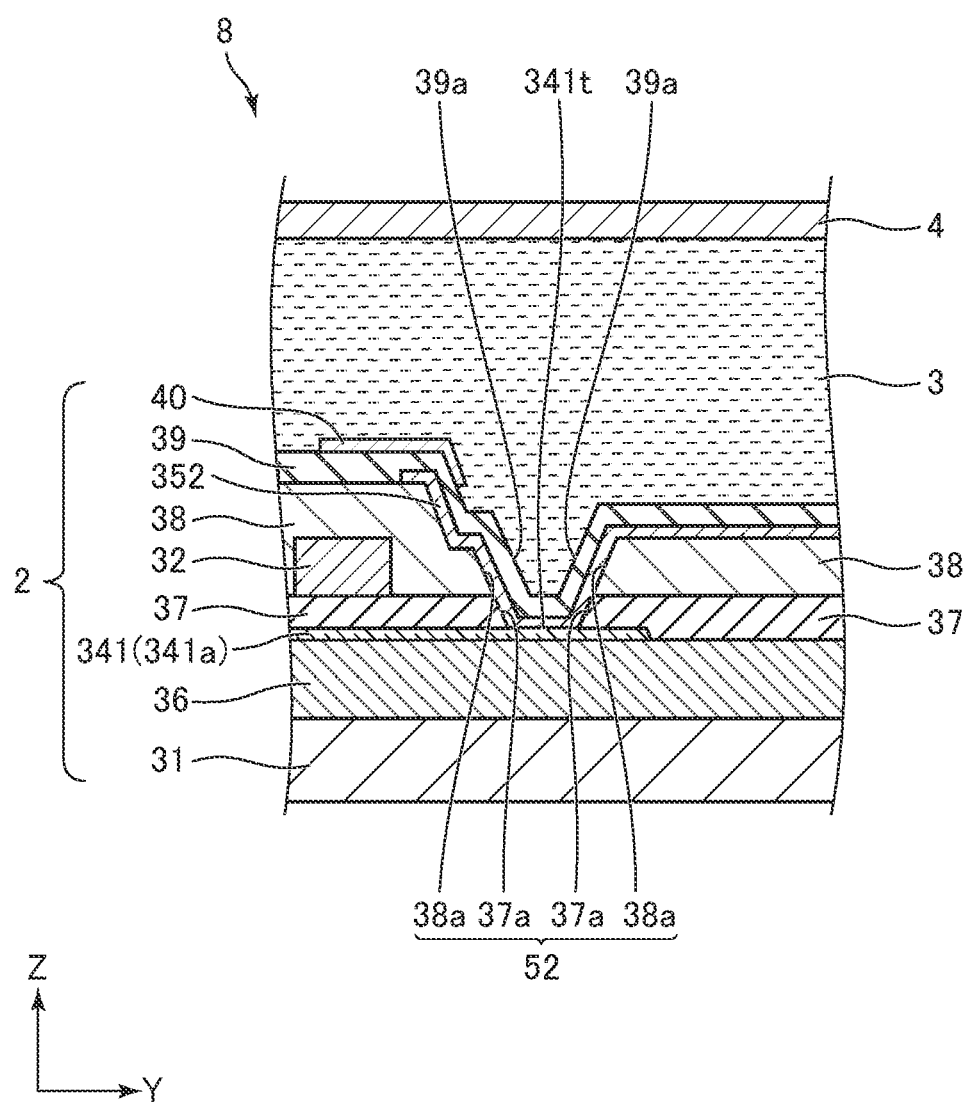
FIG. 20 is a sectional view of part of a display panel in a fifth preferred embodiment.

FIG. 20 is a sectional view of the vicinity of the second groove-shaped recess 52 included in the display panel 8 in a fifth preferred embodiment of the present disclosure. The site shown in FIG. 20 corresponds to, for instance, a site located near the second groove-shaped recess 52 shown in FIG. 5, relating to the first preferred embodiment, and FIG. 20 is a sectional view taken in the Y-direction. The configuration shown in FIG. 20 is applicable to the second preferred embodiment, the vicinity of the second groove-shaped recess 52 shown in FIG. 12 for instance.

As seen from FIG. 20, the liquid crystal layer 3 in the fifth preferred embodiment is disposed on the third insulating layer 39 and common-electrode layer 40, which are the uppermost layer of the active-matrix substrate 2. Disposed on the liquid crystal layer 3 is the counter substrate 4. The display panel 8 in the fifth preferred embodiment of the present disclosure is used in the display device 1 shown in FIG. 1. That is, in FIG. 20, light of the light source 5 is emitted from under the display panel 8, then passes through the display panel 8 and goes out from the upper surface of the display panel 8; moreover, the upper surface of the counter substrate serves as the display surface.

As illustrated in FIG. 20, the upper surface of the third insulating layer 39, which is the uppermost layer of the active-matrix substrate 2, constitutes two inner side surfaces 39a reflecting the shape of the second groove-shaped recess 52 disposed thereunder. The second groove-shaped recess 52 has a bottom surface, which is the upper surface of the first semiconductor layer 341, and two walls sandwiching the bottom surface. Here, each of the two walls is composed of the gate insulating film 37 and second insulating layer 38. In more detail, the two walls 37a of the gate insulating film 37 and the two walls 38a of the second insulating layer 38 are inclined with respect to a vertical direction in such a manner that the second groove-shaped recess 52 is wider in the Y-direction in its top than in its bottom surface.

As illustrated in FIG. 20, the second pixel electrode layer 352 extends along the following surfaces: the upper surface of one of the walls 38a, constituting the second groove-shaped recess 52; the upper surface of one of the walls 37a, constituting the second groove-shaped recess 52; the upper surface 341t of the first portion 341a of the first semiconductor layer 341; the upper surface of the other wall 38a; and the upper surface of the other wall 37a. The upper surface of the second pixel electrode layer 352 thus reflects the shape of the second groove-shaped recess 52. In addition, the third insulating layer 39 as well, which is disposed above the second pixel electrode layer 352, reflects the shape of the second groove-shaped recess 52. The third insulating layer 39 accordingly has the two inner side surfaces 39a facing each other in the Y-direction, as illustrated in FIG. 20. The two inner side surfaces 39a are inclined with respect to the vertical direction, like the walls 37a and 38a, both disposed thereunder. Although not shown, the two inner side surfaces 39a, which reflect the shape of the second groove-shaped recess 52 disposed thereunder, each extend in the X-direction in a plan view, like the second groove-shaped recess 52 shown in FIG. 4 for instance.

In the foregoing configuration, the liquid crystal layer 3 has a lower surface extending along the uppermost surface of the active-matrix substrate 2. The liquid crystal layer 3 is thus partly disposed also on the upper surface of the third insulating layer 39 including the inner side surfaces 39a in some cases. In these cases, the alignment axis of the liquid crystals contained in the liquid crystal layer 3 is preferably disposed so as to extend along the inner side surfaces 39a of the third insulating layer 39 inclined in the Y-direction or is disposed so as to extend in the X-direction, which is orthogonal to the Y-direction. That is, the liquid crystal layer 3 disposed above the plurality of pixel electrode layers 35 preferably contains liquid crystals with their alignment axis extending in the Y-direction or the X-direction. If the alignment axis of the liquid crystals does not extend in the Y-direction or the X-direction, the liquid crystal molecules arranged along the inner side surfaces 39a of the third insulating layer 39, which are formed in conformance with the second groove-shaped recess 52, are affected by the inclination of the inner side surfaces 39a of the third insulating layer 39. The alignment of the liquid crystal molecules can be disturbed locally by this influence. This causes display quality degradation, such as turbidity unevenness in a displayed image. As described in the fifth preferred embodiment, the liquid crystals with their alignment axis extending in the Y-direction or the X-direction can prevent the alignment of the liquid crystal molecules from being affected by the inclination of the inner side surfaces 39a of the third insulating layer 39, thereby keeping the display quality of the display device 1 shown in FIG. 1 high.

Sixth Preferred Embodiment

Figure 21:
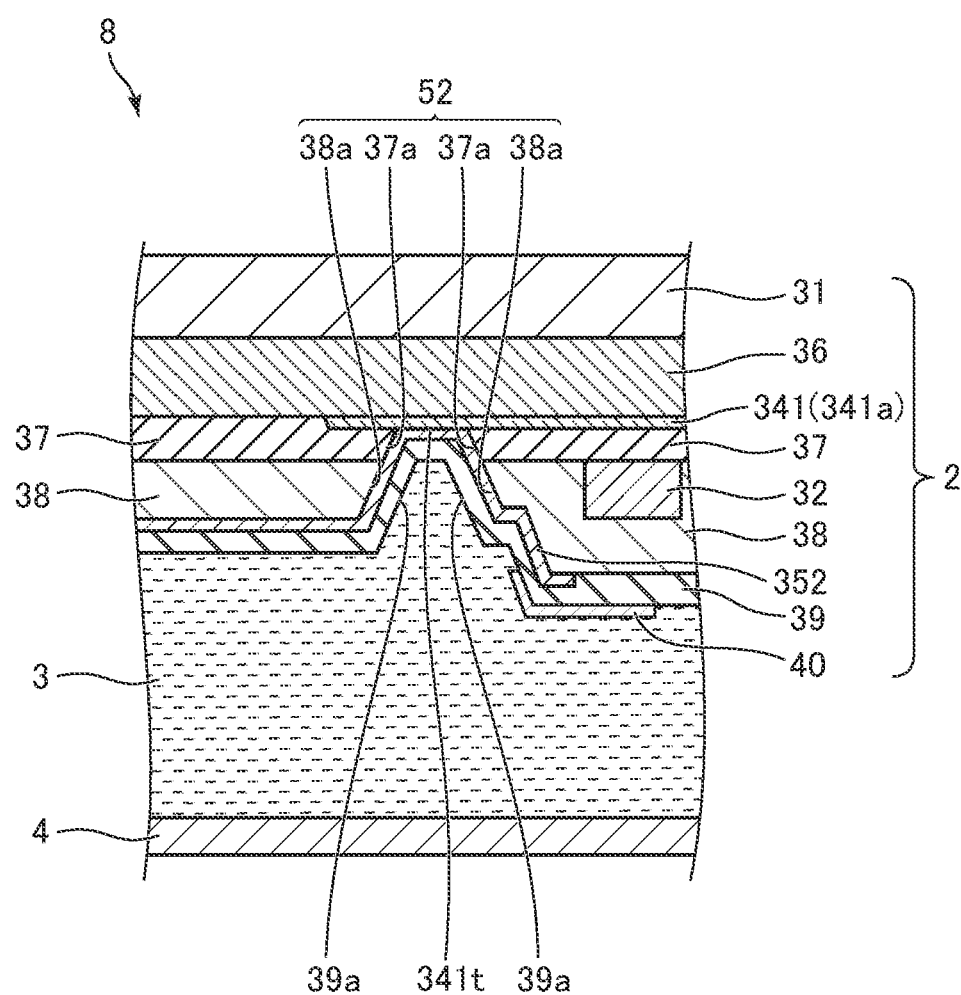
FIG. 21 is a sectional view of part of a display panel in a sixth preferred embodiment.

FIG. 21 is a sectional view of the vicinity of the second groove-shaped recess 52 included in the display panel 8 in a sixth preferred embodiment of the present disclosure. The following describes contents different from those in the fifth preferred embodiment.

As seen from FIG. 21, the liquid crystal layer 3 in the sixth preferred embodiment is disposed on the counter substrate 4. Disposed on the liquid crystal layer 3 is the active-matrix substrate 2. That is, turning the display panel 8 in the fifth preferred embodiment upside down constitutes the display panel 8 in the sixth preferred embodiment, and the display panel 8 in the sixth preferred embodiment is used in the display device 1 shown in FIG. 2. That is, in FIG. 21, light of the light source 5 is emitted from under the display panel 8, then passes through the display panel 8 and goes out from the upper surface of the display panel 8; moreover, the upper surface of the active-matrix substrate 2 serves as the display surface.

As illustrated in FIG. 21, the lower surface of the third insulating layer 39, which is the lowermost layer of the active-matrix substrate 2, constitutes the two inner side surfaces 39a reflecting the shape of the second groove-shaped recess 52 disposed thereabove. The second groove-shaped recess 52 has an upper surface, which is the lower surface of the first semiconductor layer 341, and two walls sandwiching the upper surface. Here, each of the two walls is composed of the gate insulating film 37 and second insulating layer 38. In more detail, the two walls 37a of the gate insulating film 37 and the two walls 38a of the second insulating layer 38 are inclined with respect to the vertical direction in such a manner that the second groove-shaped recess 52 is wider in the Y-direction in its bottom than in its upper surface.

As illustrated in FIG. 21, the second pixel electrode layer 352 extends along the following surfaces: the lower surface of one of the walls 38a, constituting the second groove-shaped recess 52; the lower surface of one of the walls 37a, constituting the second groove-shaped recess 52; the upper surface 341t of the first portion 341a of the first semiconductor layer 341; the lower surface of the other wall 38a; and the lower surface of the other wall 37a. The lower surface of the second pixel electrode layer 352 thus reflects the shape of the second groove-shaped recess 52. In addition, the third insulating layer 39 as well, which is disposed under the second pixel electrode layer 352, reflects the shape of the second groove-shaped recess 52. The third insulating layer 39 accordingly has the two inner side surfaces 39a facing each other in the Y-direction, as illustrated in FIG. 21. The two inner side surfaces 39a are inclined with respect to the vertical direction, like the walls 37a and 38a, both disposed thereabove. Although not shown, the two inner side surfaces 39a, which reflect the shape of the second groove-shaped recess 52 disposed thereabove, each extend in the X-direction in a plan view, like the second groove-shaped recess 52 shown in FIG. 3 for instance.

In the foregoing configuration, the liquid crystal layer 3 has an upper surface extending along the lowermost surface of the active-matrix substrate 2. The liquid crystal layer 3 is thus partly disposed also on the lower surface of the third insulating layer 39 including the inner side surfaces 39a in some cases. In these cases, the alignment axis of the liquid crystals contained in the liquid crystal layer 3 is preferably disposed so as to extend along the inner side surfaces 39a of the third insulating layer 39 inclined in the Y-direction or is disposed so as to extend in the X-direction, which is orthogonal to the Y-direction. That is, the liquid crystal layer 3 disposed under the plurality of pixel electrode layers 35 preferably contains liquid crystals with their alignment axis extending in the Y-direction or the X-direction. If the alignment axis of the liquid crystals does not extend in the Y-direction or the X-direction, the liquid crystal molecules arranged along the inner side surfaces 39a of the third insulating layer 39, which are formed in conformance with the second groove-shaped recess 52, are affected by the inclination of the inner side surfaces 39a of the third insulating layer 39. The alignment of the liquid crystal molecules can be disturbed locally by this influence. This causes degradation in the display quality of the display device 1, such as light leakage in black display. As described in the sixth preferred embodiment, the liquid crystals with their alignment axis extending in the Y-direction or the X-direction can prevent the alignment of the liquid crystal molecules from being affected by the inclination of the inner side surfaces 39a of the third insulating layer 39, thereby keeping the display quality of the display device 1 shown in FIG. 2 high.

While there have been described what are at present considered to be certain embodiments of the application, it will be understood that various modifications may be made thereto, and it is intended that the appended claim cover all such modifications as fall within the true spirit and scope of the application.

What is claimed is:

1. A semiconductor device comprising:
a substrate;
a plurality of source bus lines extending in a first direction above the substrate;
a plurality of semiconductor layers extending in the first direction above the plurality of source bus lines; and
a first insulating layer including a first groove-shaped recess extending in a second direction crossing the first direction, the first groove-shaped recess constituting a first contact hole extending from above the plurality of source bus lines to the plurality of source bus lines, the first groove-shaped recess crossing the plurality of source bus lines in a plan view,
wherein each of the plurality of semiconductor layers is disposed along a surface of the first groove-shaped recess so as to cross the first groove-shaped recess, and each of the plurality of semiconductor layers is electrically connected to each of the plurality of source bus lines on a bottom surface of the first groove-shaped recess.

2. A semiconductor device comprising:
a substrate;
a plurality of source bus lines extending in a first direction above the substrate;
a plurality of semiconductor layers extending in the first direction above the plurality of source bus lines; and
a first insulating layer including a first groove-shaped recess extending in a second direction crossing the first direction, the first groove-shaped recess constituting a first contact hole extending from above the plurality of source bus lines to the plurality of source bus lines, the first groove-shaped recess crossing the plurality of source bus lines in a plan view,
wherein:
each of the plurality of semiconductor layers is disposed along a surface of the first groove-shaped recess so as to cross the first groove-shaped recess,
each of the plurality of semiconductor layers is electrically connected to each of the plurality of source bus lines on a bottom surface of the first groove-shaped recess,
each of the plurality of semiconductor layers includes each of a plurality of straight semiconductor layers, and
each of the plurality of source bus lines includes:
a plurality of first straight portions arranged at spacing on a first virtual straight line,
a plurality of second straight portions arranged at spacing on a second virtual straight line extending in parallel to the first virtual straight line, the plurality of second straight portions being arranged together with the plurality of first straight portions alternately in the first direction, and a plurality of connecting portions each connecting together an end of a corresponding one of the plurality of first straight portions and an end of a corresponding one of the plurality of second straight portions, the ends being adjacent to each other.

3. A semiconductor device comprising:

a substrate;

a plurality of source bus lines extending in a first direction above the substrate;

a plurality of semiconductor layers extending in the first direction above the plurality of source bus lines;

a first insulating layer including a first groove-shaped recess extending in a second direction crossing the first direction, the first groove-shaped recess constituting a first contact hole extending from above the plurality of source bus lines to the plurality of source bus lines, the first groove-shaped recess crossing the plurality of source bus lines in a plan view;

a plurality of pixel electrode layers; and a second groove-shaped recess extending in the second direction, the second groove-shaped recess constituting a second contact hole extending from above the plurality of semiconductor layers to the plurality of semiconductor layers, wherein:— each of the plurality of semiconductor layers is disposed along a surface of the first groove-shaped recess so as to cross the first groove-shaped recess, each of the plurality of semiconductor layers is electrically connected to each of the plurality of source bus lines on a bottom surface of the first groove-shaped recess, each of the plurality of pixel electrode layers is disposed along a surface of the second groove-shaped recess so as to cross the second groove-shaped recess, and each of the plurality of pixel electrode layers is electrically connected to each of the plurality of semiconductor layers on a bottom surface of the second groove-shaped recess.

4. A display device comprising:

the semiconductor device according to claim 1;

a liquid crystal layer overlapping the semiconductor device; and a light source overlapping the semiconductor device and the liquid crystal layer, the light source being configured to emit light toward the liquid crystal layer, wherein the semiconductor device includes:

a plurality of gate bus lines extending in the second direction, and each of a plurality of light-blocking layers disposed above or under a corresponding one of the plurality of semiconductor layers at a location where a corresponding one of the plurality of gate bus lines and the corresponding one of the plurality of semiconductor layers cross each other, each of the plurality of light-blocking layers being disposed between the light source and the corresponding one of the plurality of semiconductor layers.

5. A display device comprising:

the semiconductor device according to claim 3; and a liquid crystal layer overlapping the semiconductor device, wherein the liquid crystal layer is disposed above the plurality of pixel electrode layers, and liquid crystal molecules contained in the liquid crystal layer applied with a voltage are aligned in the first direction or the second direction.

6. The display device according to claim 4, wherein the plurality of semiconductor layers are made of a material having light transparency.

* * * * *